(12) United States Patent
Jiang et al.

(10) Patent No.: US 8,227,896 B2
(45) Date of Patent: Jul. 24, 2012

(54) RESISTIVE SWITCHING IN NITROGEN-DOPED MGO

(75) Inventors: Xin Jiang, San Jose, CA (US); Stuart Stephen Papworth Parkin, San Jose, CA (US); Mahesh Govind Samant, San Jose, CA (US); Cheng-Han Yang, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 329 days.

(21) Appl. No.: 12/636,588

(22) Filed: Dec. 11, 2009

(65) Prior Publication Data

US 2011/0140762 A1    Jun. 16, 2011

(51) Int. Cl.
*H01L 29/00* (2006.01)
(52) U.S. Cl. ............ 257/536; 257/537; 257/E21.004; 257/E43.004; 365/100; 365/171; 365/225.5
(58) Field of Classification Search ........... 257/536, 257/537, E21.004, E43.004; 365/100, 171, 365/225.5
See application file for complete search history.

(56) References Cited

U.S. PATENT DOCUMENTS

| | | | |
|---|---|---|---|
| 6,359,289 B1 | 3/2002 | Parkin | |
| 6,756,128 B2 | 6/2004 | Carey et al. | |
| 6,794,696 B2 * | 9/2004 | Fukuzumi | 257/295 |
| 6,828,260 B2 | 12/2004 | Sharma et al. | |
| 6,963,099 B2 * | 11/2005 | Fukuzumi | 257/295 |
| 6,999,288 B2 | 2/2006 | Sone et al. | |
| 7,138,350 B2 * | 11/2006 | Sakurai et al. | 501/108 |
| 7,349,187 B2 * | 3/2008 | Parkin | 360/324.2 |
| 7,420,786 B2 * | 9/2008 | Sugiyama et al. | 360/322 |
| 7,576,956 B2 | 8/2009 | Huai | |
| 7,746,601 B2 * | 6/2010 | Sugiyama et al. | 360/322 |
| 2004/0056288 A1 * | 3/2004 | Fukuzumi | 257/295 |
| 2004/0082081 A1 | 4/2004 | Sharma | |
| 2005/0045065 A1 * | 3/2005 | Sakurai et al. | 106/286.8 |
| 2005/0195532 A1 * | 9/2005 | Sugiyama et al. | 360/322 |
| 2006/0093862 A1 * | 5/2006 | Parkin | 428/811.1 |
| 2007/0053112 A1 * | 3/2007 | Papworth Parkin | 360/324.2 |
| 2007/0114508 A1 | 5/2007 | Herner et al. | |
| 2007/0152253 A1 * | 7/2007 | Lee et al. | 257/295 |
| 2008/0253039 A1 | 10/2008 | Nagamine et al. | |
| 2008/0285183 A1 * | 11/2008 | Sugiyama et al. | 360/324.11 |
| 2009/0154222 A1 | 6/2009 | Chien et al. | |

(Continued)

OTHER PUBLICATIONS

Matteo Pesci et al., "Nature of Defect States in Nitrogen-Doped MgO", Journal of Phys. Chem. C., vol. 114, 2010, pp. 1350-1356.

(Continued)

*Primary Examiner* — Ngan Ngo
(74) *Attorney, Agent, or Firm* — Daniel E. Johnson

(57) ABSTRACT

Nitrogen-doped MgO insulating layers exhibit voltage controlled resistance states, e.g., a high resistance and a low resistance state. Patterned nano-devices on the 100 nm scale show highly reproducible switching characteristics. The voltage levels at which such devices are switched between the two resistance levels can be systematically lowered by increasing the nitrogen concentration. Similarly, the resistance of the high resistance state can be varied by varying the nitrogen concentration, and decreases by orders of magnitude by varying the nitrogen concentrations by a few percent. On the other hand, the resistance of the low resistance state is nearly insensitive to the nitrogen doping level. The resistance of single $Mg_{50}O_{50-x}N_x$ layer devices can be varied over a wide range by limiting the current that can be passed during the SET process. Associated data storage devices can be constructed.

33 Claims, 20 Drawing Sheets

U.S. PATENT DOCUMENTS

| | | | |
|---|---|---|---|
| 2009/0296451 A1 | 12/2009 | Asao | |
| 2011/0026307 A1* | 2/2011 | Khoury et al. | 365/148 |
| 2011/0026317 A1* | 2/2011 | Zhu et al. | 365/158 |
| 2011/0236568 A1* | 9/2011 | Liu et al. | 427/125 |
| 2011/0292716 A1* | 12/2011 | Lu et al. | 365/148 |

OTHER PUBLICATIONS

Phivos Mavropoulos et al., "Ferromagnetism in nitrogen-doped MgO: Density-functional calculations", Physical Review B., vol. 80, 2009, pp. 184403-1 through 184403-9.

Koo Woong Jeong et al., "Resistive Switching Characteristics of Unique Binary-Oxide MgO Films", Journal of the Korean Physical Society, vol. 48, No. 6, Jun. 2006, pp. 1501-1504.

PCT International Search Report Dated Dec. 23, 2010, PCT Application No. PCT/EP2010/063883.

Phivos Mavropoulos et al., "Ferromagnetism in Nitrogen-doped MgO", Journal: Physical Review B 2009, vol. 80, No. 184403, pp. 1-10.

Bo Gu et al., "Possible d0 ferromagnetism in MgO doped with nitrogen", Journal: Physical Review B 2009, vol. 79, No. 024407, pp. 1-8.

Myoung-Jae Lee et al., "Two Series Oxide Resistors Applicable to High Speed and High Density Nonvolatile Memory", Advanced Materials 2007, vol. 19, pp. 3919-3923.

Rainer Waser et al., "Redox-Based Resistive Switching Memories—Nanoionic Mechanisms, Prospects, and Challenges", Advanced Materials 2009, vol. 21, pp. 2632-2663.

I.S. Elfimov et al., "Magnetizing Oxides by Substituting Nitrogen for Oxygen", The American Physical Society, Physical Review Letters, Mar. 2007, PRL 98, pp. 13702-13072-4.

T. Sakamoto et al., "Nanometer-scale switches using copper sulfide", American Institute of Physics 2003, Applied Physics Letters, May 5, 2003, vol. 82, No. 18, pp. 3032-3034.

S. Seo et al., "Reproducible resistance switching in polycrystalline NiO films", American Institute of Physics 2004, Applied Physics Letters, Dec. 6, 2004, vol. 85, No. 23, pp. 5655-5657.

Christina Rohde et al., "Identification of a determining parameter for resistive switching of TiO2 thin films", American Institute of Physics 2005, Applied Physics Letters, vol. 86, No. 26, pp. 262907-262907-3.

D.C. Kim et al, "Electrical observations of filamentary conductions for the resistive memory switching in NiO films", American Institute of Physics 2006, Applied Physics Letters, vol. 88, No. 20, pp. 202102-202102-3.

Chikako Yoshida et al., "High speed resistive switching in Pt/TiO2/TiN film for nonvolatile memory application", American Institute of Physics 2007, Applied Physics Letters, vol. 91, No. 22, pp. 223510-223510-3.

J.Y. Son et al., "Direct observation of conducting filaments on resistive switching of NiO thin films", American Institute of Physics 2008, Applied Physics Letters vol. 92, No. 22, pp. 222106-222106-3.

Nuo Xu et al., "Characteristics and mechanism of conduction/set process in TiN/ZnO/Pt resistance switching random-access memories", American Institute of Physics 2008, Applied Physics Letters, vol. 92, No. 23, pp. 232112-232112-3.

Xinman Chen et al., "Resistive switching behavior of Pt/Mg0.2Zn0.8O/Pt devices for nonvolatile memory applications", American Institute of Physics 2008, Applied Physics Letters, vol. 93, No. 9, pp. 093501-093501-3.

Chan Woo Park et al., "Role of structural defects in the unipolar resistive switching characteristics of Pt/NiO/Pt structures", American Institute of Physics 2008, Applied Physics Letters, vol. 93, No. 4, pp. 042102-042102-3.

Xinman Chen et al., "Colossal resistance switching effect in Pt/spinel-MgZnO/Pt devices for nonvolatile memory applications", American Institute of Physics 2009, Applied Physics Letters, vol. 94, No. 3, pp. 033501-033501-3.

H.Y. Lee et al., "Low Power and High Speed Bipolar Switching with a Thin Reactive Ti Buffer Layer in Robust HfO2 Based RRAM", IEEE Xplore, Electron Devices Meeting, 2008, INSPEC Accession No. 10500526, Digital Object Identifier: 10.1109/IEDM.2008. 4796677, Current Version Published: Feb. 7, 2009, pp. 1-4.

Yu Chao Yang et al., "Fully Room-Temperature-Fabricated Nonvolatile Resistive Memory for Ultrafast and High-Density Memory Application", American Chemical Society, Nano Letters 2009, vol. 9, No. 4, pp. 1636-1643.

Yajie Dong et al., "Si/a-Si Core/Shell Nanowires as Nonvolatile Crossbar Switches", American Chemical Society, Nano Letters 2008, vol. 8, No. 2, pp. 386-391.

Sung Hyun Jo et al., "CMOS Compatible Nanoscale Nonvolatile Resistance Switching Memory", American Chemical Society, Nano Letters 2008, vol. 8, No. 2, pp. 392-397.

Rainer Waser et al., "Nanoionics-based resistive switching memories", Nature Publishing Group 2007, vol. 6, pp. 833-840.

K. Terabe et al., "Quantized conductance atomic switch", Nature Publishing Group 2005, vol. 433, pp. 47-50.

* cited by examiner

RESISTIVE SWITCHING IN NITROGEN-DOPED MGO

This invention was made with Government support under HR0011-09-C-0002 awarded by the Defense Advanced Research Projects Agency (DARPA). The Government has certain rights in this invention.

TECHNICAL FIELD

The invention relates to resistive switching elements and their use in data storage, logic applications, and more particularly, to resistive switching elements that include nitrogen-doped MgO material.

BACKGROUND

There is a great demand for non-volatile memory for many computing and storage applications. In recent years this need has grown, especially as a result of the proliferation of handheld consumer electronic devices. FLASH memory is the leading non-volatile memory technology, largely because of its low cost per bit and the simple scaling of its cost with memory size (unlike magnetic disk drives, for example). However, the continued scaling of FLASH memory to higher capacities has significant challenges due particularly to the difficulty in scaling the tunnel oxide while maintaining long term charge storage. Thus, there may be a need for alternate scalable, non-volatile memory technologies.

SUMMARY

One embodiment of the invention is a device that includes an array of resistive switching elements each of which is in electrical communication with a word line and a bit line. Each of the elements includes a nitrogen (N)-doped MgO dielectric layer (e.g., having a thickness between 1 nm and 100 nm) whose N content is at least 0.1 atomic percent of the layer, e.g., between 0.1 and 14 atomic percent of the layer. For example, the N content of each dielectric layer may be at least 2, 5, or 8 (or more) atomic percent of the layer. In a preferred embodiment, a given switching element has an "ON" state having a resistance $R_{Low}$ and an "OFF" state having a resistance $R_{High}$, wherein the ratio $R_{High}/R_{Low}$ is between 10 and $10^6$. Also, in a preferred embodiment, no initialization (forming) step is required before data can be written into the device. Data stored in the switching elements can replaced by overwriting the data with different data, e.g., data can be written, erased, and re-written hundreds of times or more.

One aspect of the invention is a method that includes applying voltage to a particular one (or more, or even all) of the elements described above, thereby changing the resistance state of said particular element, wherein the voltage is selected in view of its N content. For example, the resistance of said particular element can be increased or decreased as a result of applying the voltage. The method may include applying a SET voltage to said particular element, thereby switching it to an "ON" state having a resistance $R_{Low}$ between $R_a$ and $R_b$; and applying a RESET voltage to said particular element, thereby switching it to an "OFF" state having a resistance $R_{High}$ between $R_c$ and $R_d$, wherein $R_a < R_b < R_c < R_d$. Voltage pulses may be applied across a plurality of the elements, so that the conductance of the device evolves plastically in a way that depends upon the relative arrival times of the voltage pulses, the device thereby acting as a synaptic device.

Another aspect of the invention is a method for use with a resistive switching element, the element including i) a first conducting layer, ii) a $Mg_{50}[O_{50-x}N_x]$ dielectric layer, wherein x is at least 0.1, and iii) a second conducting layer. The first conducting layer, the dielectric layer, and the second conducting layer are in proximity with each other, thereby allowing current to pass through the first conducting layer, the dielectric layer, and the second conducting layer. The method comprises applying voltage to the element, thereby changing its resistance state. The first and second conducting layers may both include ferromagnetic material, or they may include non-magnetic material. In one exemplary method, this element is part of an electrical circuit that includes at least one other electrical component, and the method further comprises applying a voltage pulse to the element, thereby eliminating an electrical connection between the element and said at least one other electrical component, the element thereby acting as a fuse; the method may further comprise applying voltage to the element, so that an electrical connection between the element and said at least one other electrical component is reestablished. In another exemplary method, this element is in proximity with an electrical component, and the method comprises applying voltage across the element to create an ON state, thereby forming a filament within the element having a diameter that is smaller than a diameter of the electrical component, so that the element acts as a point contact injector for the electrical component.

BRIEF DESCRIPTION OF THE DRAWINGS

FIG. 8 includes FIGS. 8A and 8B, in which:

FIG. 9 includes FIGS. 9A and 9B, in which:

FIG. 10 includes FIGS. 10A, 10B, and 10C, in which:

FIG. 11 includes FIGS. 11A and 11B, in which:

FIG. 13 includes FIGS. 13A, 13B, and 13C, in which:

DETAILED DESCRIPTION

Figure 1:
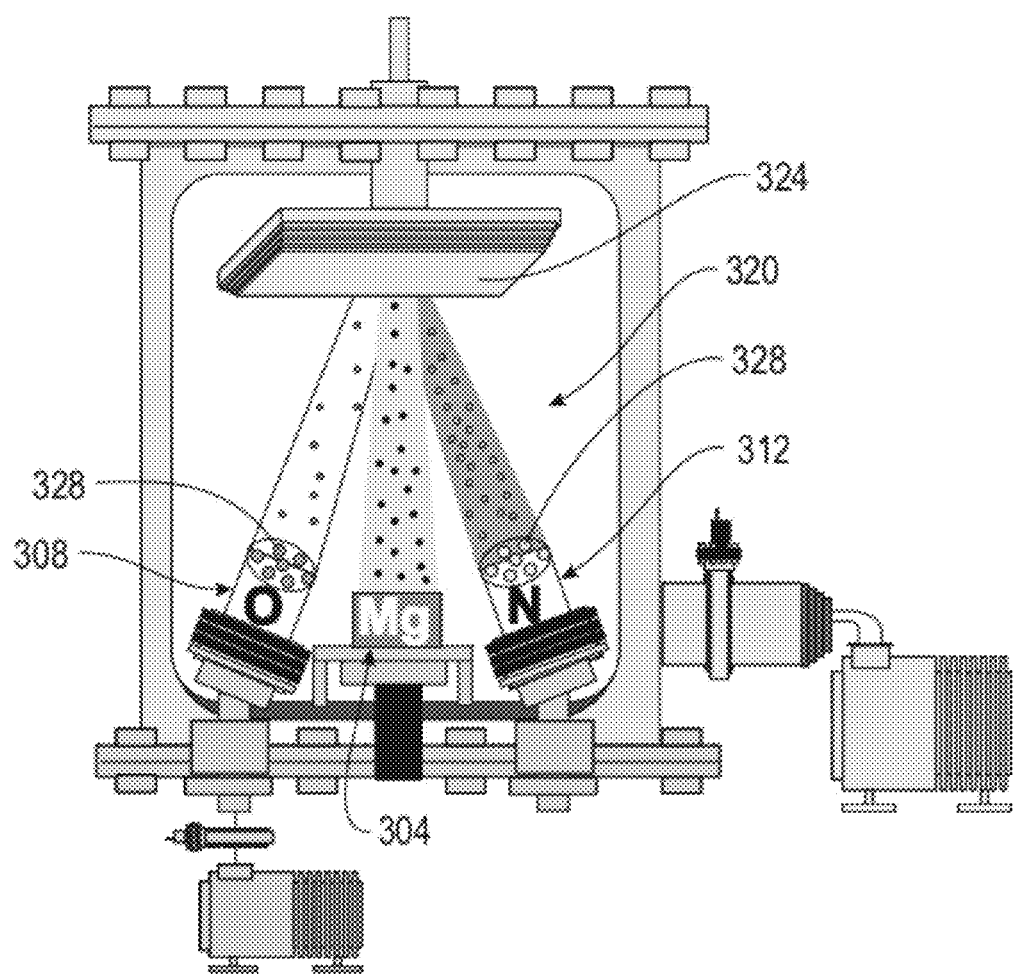
FIG. 1 is a schematic illustration of the oxide molecular beam epitaxy (MBE) system. The MBE chamber consisted of a Knudsen cell for evaporation of elemental Mg and two rf-plasma generators as independent sources for O and N.

Preferred embodiments of the invention disclosed herein include thin dielectric layers and employ resistive switching of those layers. The basic structure of a resistive switching device is a thin layer of a dielectric material sandwiched between two conducting electrodes in a so-called MIM (metal-insulator-metal) structure[1]. Dielectric materials with a wide range of electrical properties have been used in such structures, including normally insulating oxides[2-6] and wide band-gap semiconductors[6,7]. A typical MIM device exhibits at least two resistive states: i) a low resistance state ($R_{Low}$), also referred to as the ON state and ii) a high resistance state ($R_{High}$), also referred to as the OFF state. $R_{Low}$ can be several orders of magnitude smaller than $R_{High}$. Toggling between these states is carried out by the application of a voltage pulse between the conducting electrodes. By applying a voltage exceeding a higher threshold voltage, known as the SET voltage ($V_{SET}$), the device is switched into a more conducting state (ON state), typically believed to be due to the creation of conducting paths through the dielectric layer[8]. By subsequently applying a lower voltage, known as the RESET voltage ($V_{RESET}$), the device is toggled back to the OFF state, presumably by the disruption of previously formed conductive paths. Several mechanisms for the formation of conductive filaments have been proposed, including the drift of defects such as oxygen vacancies in transition metal oxides[9,10] and metal migration from certain metal electrodes such as those formed from Ag or Cu[11,12]. Since the resistive switching device has a fast response time, is scalable, and has very low power consumption, it may have application as a non-volatile memory element[1,8,13].

The semiconducting and insulating materials which, heretofore, exhibit resistive switching, typically are susceptible to the presence of defects, whose concentration depends on the exact details of the preparation conditions of the material. By contrast, the alkaline earth metal oxides (which include MgO, CaO and SrO) usually contain few oxygen vacancies due to their very strong and ionic bonding. Therefore, these insulating oxides would not be expected to exhibit resistive switching, and indeed there has been little convincing experimental evidence heretofore that they do. By contrast ZnO is well known to be defective, and it has been shown that a range of oxides of the form $Mg_xZn_{1-x}O$ do show resistive switching characteristics[14,15]. However, these oxides can form several structures depending on the Mg/Zn ratio and, moreover, changing the Mg/Zn ratio also significantly changes the electronic band gap of the oxide, thereby dramatically changing its transport properties.

Resistive switching in thin layers is disclosed herein, in which the thin layers include MgO doped with small amounts of nitrogen. The addition of nitrogen does not change either the simple cubic structure of the MgO or significantly alter its electronic band gap, thereby enabling a systematic change in resistive switching properties of the MgO. In particular, the ratio of the resistance change ($R_{High}/R_{Low}$) can be varied by several orders of magnitude, and the SET and RESET voltages can be systematically lowered, by varying the nitrogen content of the layer. The resistive switching properties of the N-doped MgO structures have several other attractive features. In particular, resistive switching is demonstrated to occur at least as fast as one nanosecond by applying SET and RESET voltage pulses from 1-100 nsec in duration. Multi-level resistive switching is also demonstrated.

Experimental Details

MIM structures, formed from Ta/Pt/$Mg_{50}O_{50-x}N_x$/Pt, were deposited on amorphous silicon oxide (250 Å thick) grown on Si(100) substrates. The bottom and top metal electrodes formed from, respectively, 100 Å Ta/ 300 Å Pt and 100 Å Pt, were deposited at room temperature via magnetron sputtering in a high vacuum chamber (base pressure ~5×10$^{-9}$ Torr). The N-doped MgO layer, $Mg_{50}O_{50-x}N_x$, was deposited by thermal evaporation in an independent ultra high vacuum (UHV) chamber (base pressure <1×10$^{-10}$ Torr). The two deposition chambers are interconnected via a third UHV chamber equipped with a computer controlled robot by which the samples can be moved between chambers in high vacuum. FIG. 1 shows a schematic diagram of a thermal evaporation apparatus 310 which is equipped with a Knudsen cell 304 (K cell) for evaporation of elemental Mg and two sources 308, 312 of atomic oxygen and atomic nitrogen, respectively. These sources 308, 312 use rf power to disrupt the bonds of molecular oxygen ($O_2$) and nitrogen ($N_2$) contained within a reactor vessel to form atomic O and N. The reactor vessel is 24.5 mm in diameter and 80 mm in length and designed for the delivery of atomic species to wafers 324 1 inch in diameter. The O and N atom reactor vessels are made from quartz and pyrolytic boron nitride, respectively. The atomic O and N are admitted to the vacuum deposition chamber 320 via small numbers of tiny laser drilled holes 328 in the reactor vessels, thereby allowing for much higher gas pressures within the reactor vessels than within the vacuum deposition chamber 320 itself. The reactor vessel of the O atom source has 16 apertures 328, each with a diameter of ~0.15-0.25 mm, with the apertures 328 being equidistantly separated along a circle having a diameter of ~18 mm. The N atom reactor vessel has 150 apertures 328, each being ~0.5 mm in diameter, with the apertures 328 being arranged regularly over the area of a circle of diameter ~18 mm.

Figure 2:
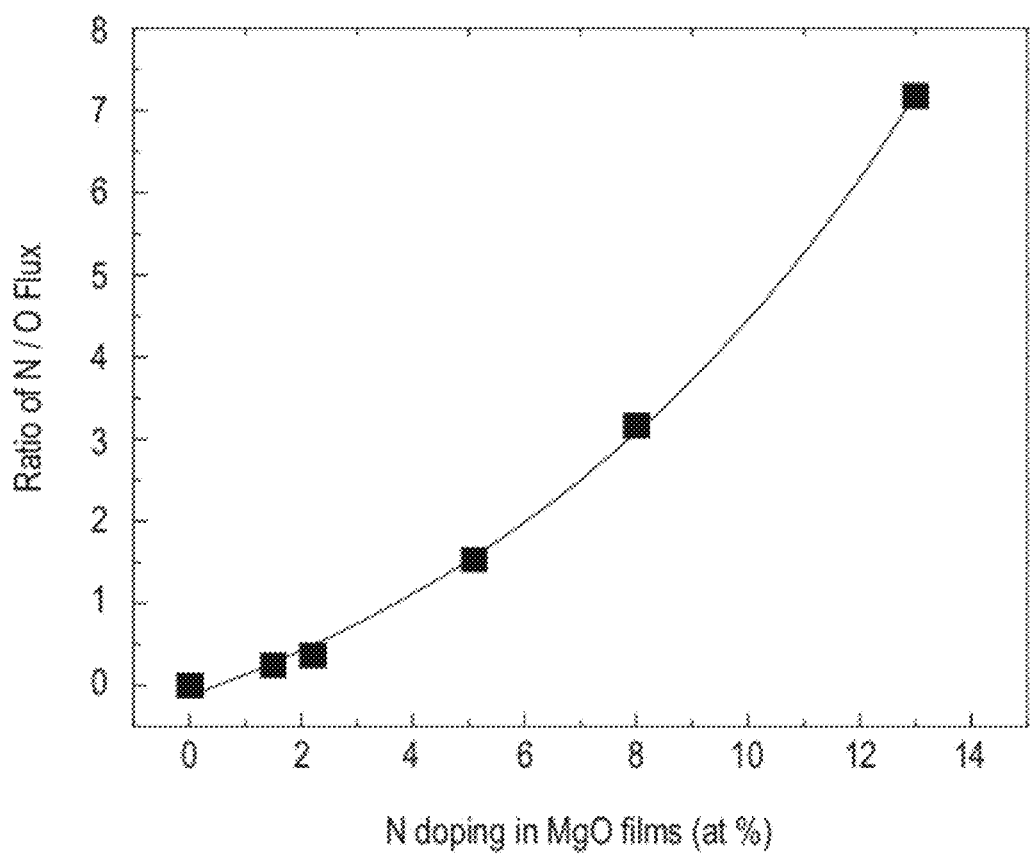
FIG. 2 shows the ratio of N to O flux versus N doping in the MgO thin films. The solid squares are the measurement of N to O ratio in the gas phase during growth conditions, and the line is the fit to the data using an exponential equation (y=2.15 exp(x/8.75)−2.25).

Since the reactivity of O with Mg is significantly higher than that of N, it is necessary to have a significant excess number of N atoms as compared to O atoms in the vacuum deposition chamber 320 if N is to be incorporated in the MgO. This was accomplished by designing and building special reactor vessels for the atomic sources 308, 312; these vessels have a small number of apertures at one end of the reactor vessel, with a much lower number of apertures for the oxygen source than for the nitrogen source. This allowed for the deposition of high quality stoichiometric $Mg_{50}O_{50-x}N_x$ films in the chamber 320 at a total operating pressure on the order of $10^{-6}$ Torr to $10^{-5}$ Torr, depending upon the level of N doping. The level of N doping was varied by changing the ratio of the N to O partial pressures in the chamber 320 by adjusting the flow rate of molecular oxygen and nitrogen supplied to the respective rf atom sources. FIG. 2 is a plot of the ratio of the N to O partial pressures in the chamber during deposition versus the N doping level subsequently measured in the deposited $Mg_{50}O_{50-x}N_x$ films using the technique of Rutherford backscattering analysis. These data clearly show that the ratio of N to O needed to obtain a certain N concentration in the $Mg_{50}O_{50-x}N_x$ film increases non-linearly with the N concentration. Indeed, a fit to the data in FIG. 2 (solid line) reveals that the N to O ratio increases exponentially with x.

During deposition, the magnesium K-cell temperature was maintained at 358° C. This temperature was determined by a compromise between a growth rate that was not so low that a number of samples could not be grown per day, and a reasonable lifetime for the Mg charge in the K-cell so that the charge would not need to be replaced too often. The K-cell temperature could be operated at a range of temperatures from ~275 to ~400° C. The substrate was heated during deposition (using an oxygen resistant heater formed from silicon carbide). All films were grown at a nominal substrate temperature of 350° C. The deposition rate depends on the gas pressure in the chamber: A typical rate was ~0.07 Å/sec. The rf plasma generators were typically operated at 300 W during deposition.

Figure 3:
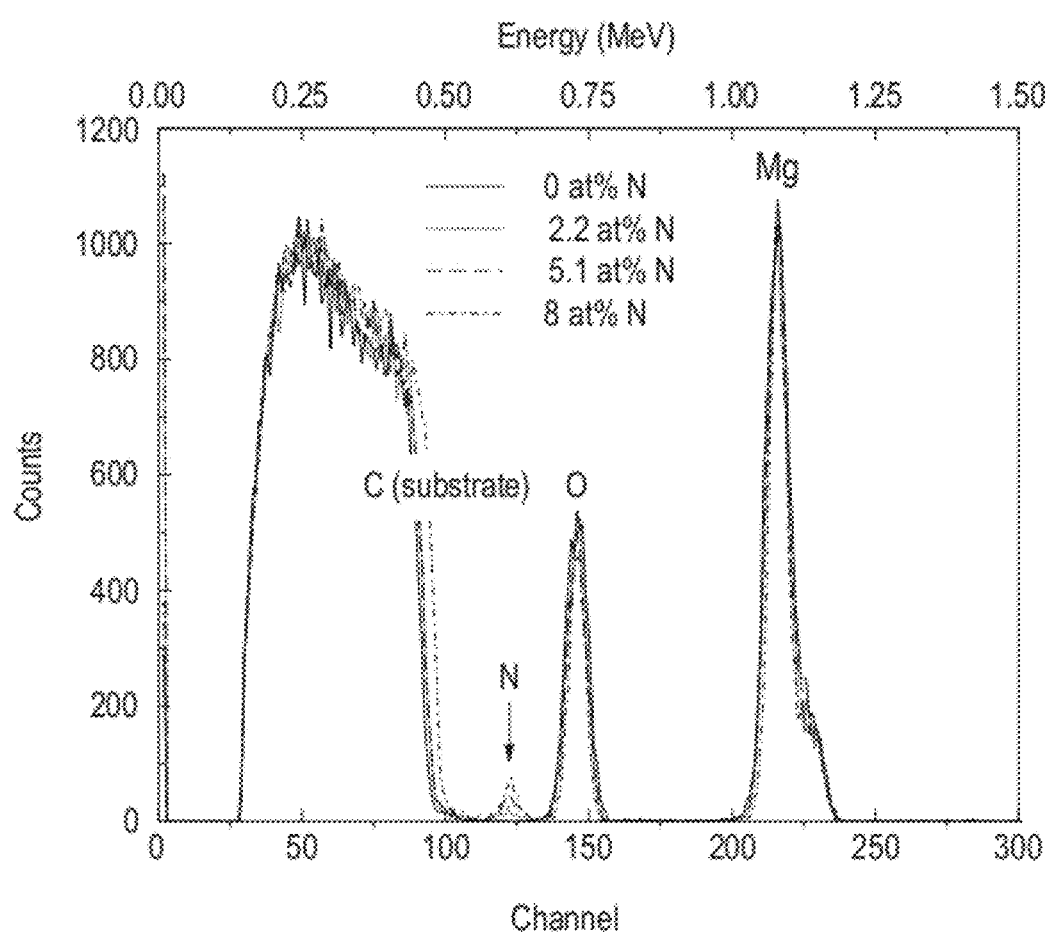
FIG. 3 shows the result of Rutherford backscattering (RBS) analysis used to characterize the film thickness and composition. The use of graphite substrates allows for a composition detection limit as low as 0.5 at %. The upper axis shows the energy of the backscattered helium ions, and the lower axis shows the channel number in the detector: Each channel integrates backscattered helium ions with energies in 5 keV increments.

Rutherford backscattering (RBS) analysis was used to determine the deposition rate and the film composition. In order to precisely determine the composition of the $Mg_{50}O_{50-x}N_x$, special films were deposited on graphite substrates (that contained no oxygen) rather than on $SiO_2$/Si. A detection limit from the RBS analysis of x~0.5% was then possible. FIG. 3 shows RBS data for 4 different $Mg_{50}O_{50-x}N_x$ film samples with x=0, 2.2, 5.1 and 8%. The RBS data clearly indicate that these samples contain nitrogen.

Figure 4:
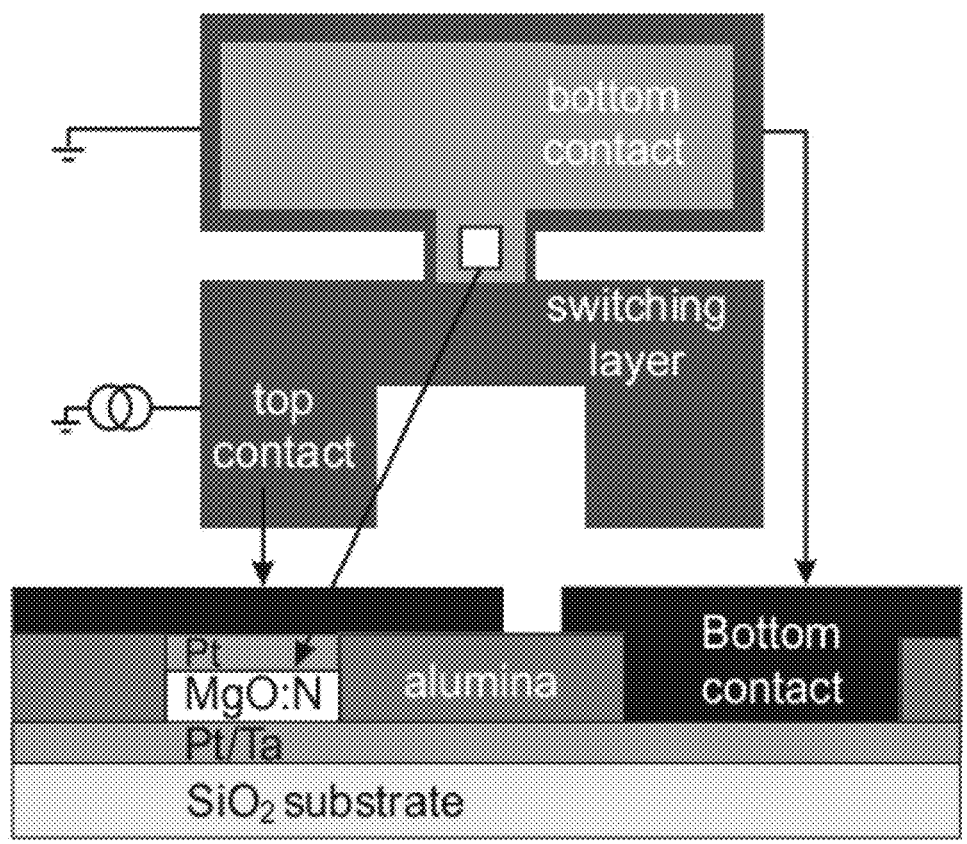
FIG. 4 is a schematic illustration of a preferred N-doped MgO resistive switching device. Two-terminal devices were fabricated with their sizes varying from 50×100 to 90×270 $nm^2$ and from 1×2 to 5×15 $\mu m^2$ using e-beam and optical lithography, respectively.

The MIM structures were patterned into devices suitable for electrical testing by means of electron beam lithography, optical lithography, and argon ion milling. The structure of these devices is shown schematically in FIG. 4. First, a resist is spun coated onto the deposited film structure, exposed and developed. Then the resist is used as a mask to define the area of the MIM device using argon ion milling. The MIM device sizes were varied from ~50×100 to ~90×270 $nm^2$ and from ~1×2 to ~5×15 $\mu m^2$ using electron beam and optical lithography, respectively. The milling is end pointed (not shown) approximately in the middle of the $Mg_{50}O_{50-x}N_x$ $Mg_{50}O_{50-x}N_x$ layer. An alumina layer is then deposited to surround the edges of the MIM devices and, after resist removal, a top contact layer formed from Ta/Au is deposited and patterned using an optical lithographic process and argon ion milling.

Care was taken to minimize the effect of stray capacitance during electrical measurements. The stored charge in the stray capacitances of the contact wires can lead to unwanted charge injection during the SET processes: This can readily exceed the compliance current if not carefully controlled. Such overshoot currents may damage the devices due to, for example, electromigration from the metal electrodes.

Figure 5:
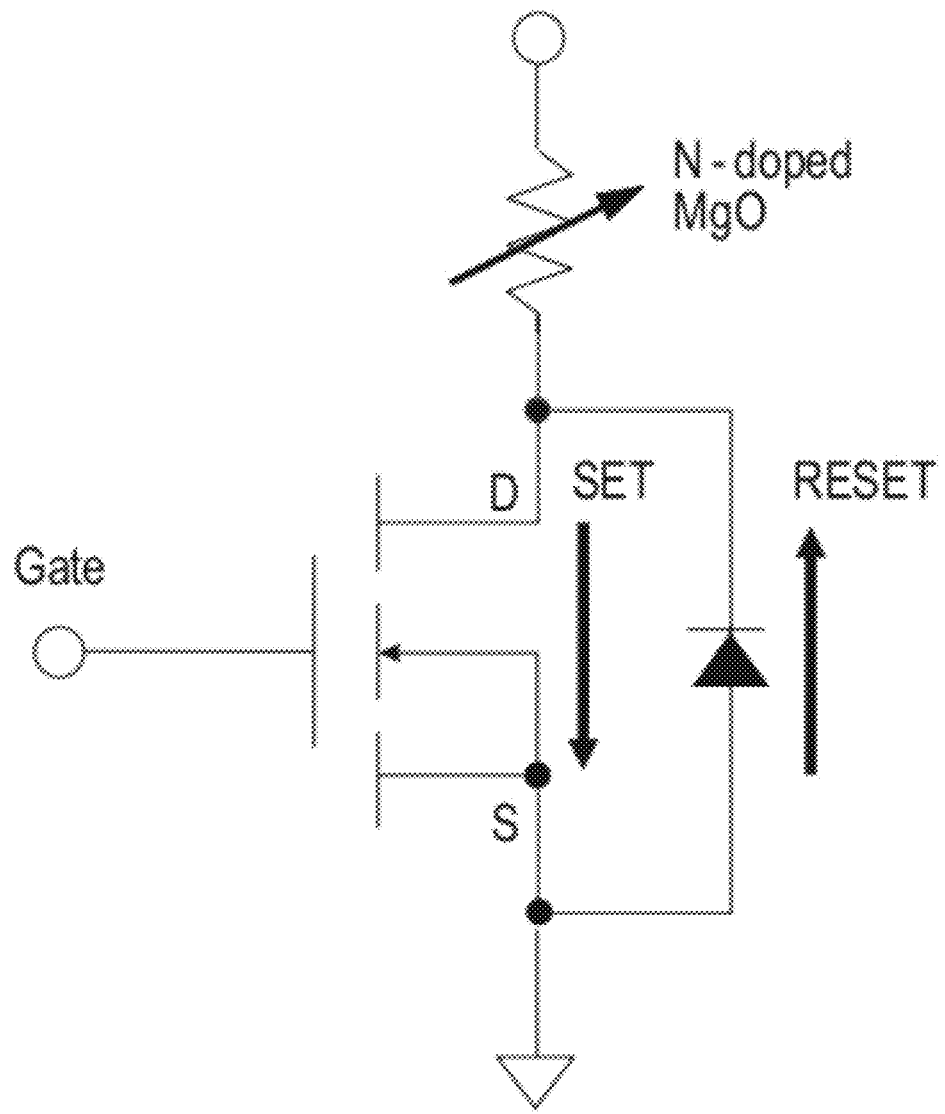
FIG. 5 is a schematic of the circuit used during testing of the resistive switching devices. An N-MOSFET transistor in parallel with a diode was wire-bonded in series to the N-doped MgO resistive switching device. During the SET process, the current flows through the transistor, and its magnitude is controlled by the gate voltage. During the RESET process, the current flows through the diode. The device is operated in bi-polar mode.

To avoid damage to the MIM device from excessively high currents when the SET voltage is applied (to change the device from the high to the low resistance state), some mechanism must be used to limit the maximum current that can flow through the device. The method used here is to connect the MIM device to a transistor. By applying a gate voltage to the transistor, the maximum current that can flow through the device can be both limited and varied. Here an N-MOSFET transistor wired in parallel with a diode was attached to the MIM device. This necessitated testing of the MIM device in a bipolar mode of operation. A schematic diagram of the circuit is shown in FIG. 5. The N-MOSFET gate voltage limits the current flowing though the N-MOSFET transistor. This was used to limit the current that could pass through the MIM device during the SET process. A reverse voltage was used during the RESET process so that the current flows only through the diode: This allowed for a larger current to flow during the RESET process than during the SET process.

Experimental Results

Figure 6:
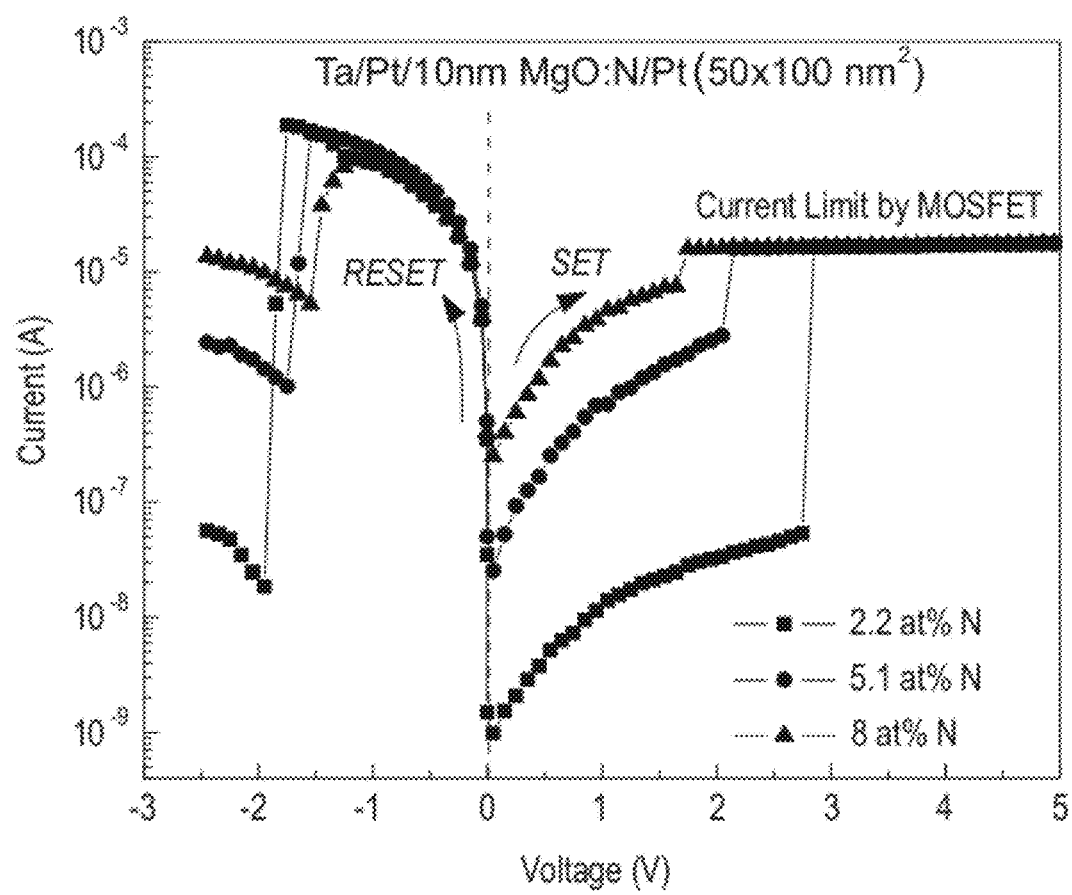
FIG. 6 illustrates typical I-V characteristics of devices disclosed herein having 10 nm thick N-doped MgO films as the resistive layer. The nitrogen doping level was varied. All measurements were performed using DC voltage sweep. The device size was 50×100 $nm^2$ and patterned using e-beam lithography.

Typical current versus voltage (I-V) characteristics of three $Mg_{50}O_{50-x}N_x$ MIM devices for x=2.2, 5.1 and 8% are shown in FIG. 6. Results are shown for devices patterned by electron beam lithography with areas of 50×100 $nm^2$. It is important to note that no forming step is required for any of these devices[4]. (Note that no reversible switching was observed for x=0, i.e., MgO without nitrogen.) The device, as prepared, is initially in the high resistance state. As shown in FIG. 6, as the voltage is swept in a positive direction from V=0, an abrupt increase in current is observed at a voltage, $V_{SET}$, as the device is switched to the low resistance state. $V_{SET}$ depends on the N content and decreases as the N doping level is increased. Note that, as indicated in FIG. 6, the current that flows once the device is switched to the low resistance state is limited to ~$2\times10^{-5}$ A by the transistor in series with the device. The voltage is then decreased to zero and swept to negative values. A sudden drop in device current is observed at a voltage $V_{RESET}$ at which point the device is switched back to a high-resistance state ($R_{High}$). $V_{RESET}$ is ~−1.5 V but again systematically varies with the N content of the MgO layer, decreasing with increasing N content. Note that the RESET voltage is always lower than the SET voltage.

Once the resistance of the MIM device is switched to either $R_{High}$ or $R_{Low}$ this resistance is unchanged unless a voltage level is applied whose absolute value exceeds that of $V_{SET}$ or $V_{RESET}$, respectively, thereby permitting non-destructive reading of the MIM device. Hence, nitrogen-doped MgO layers exhibit low and high resistive states that can be switched by means of voltage. Moreover, these resistance states differ by many orders of magnitude, thereby recommending nitrogen-doped MgO for a variety of applications including non-volatile memory applications.

Figure 7:
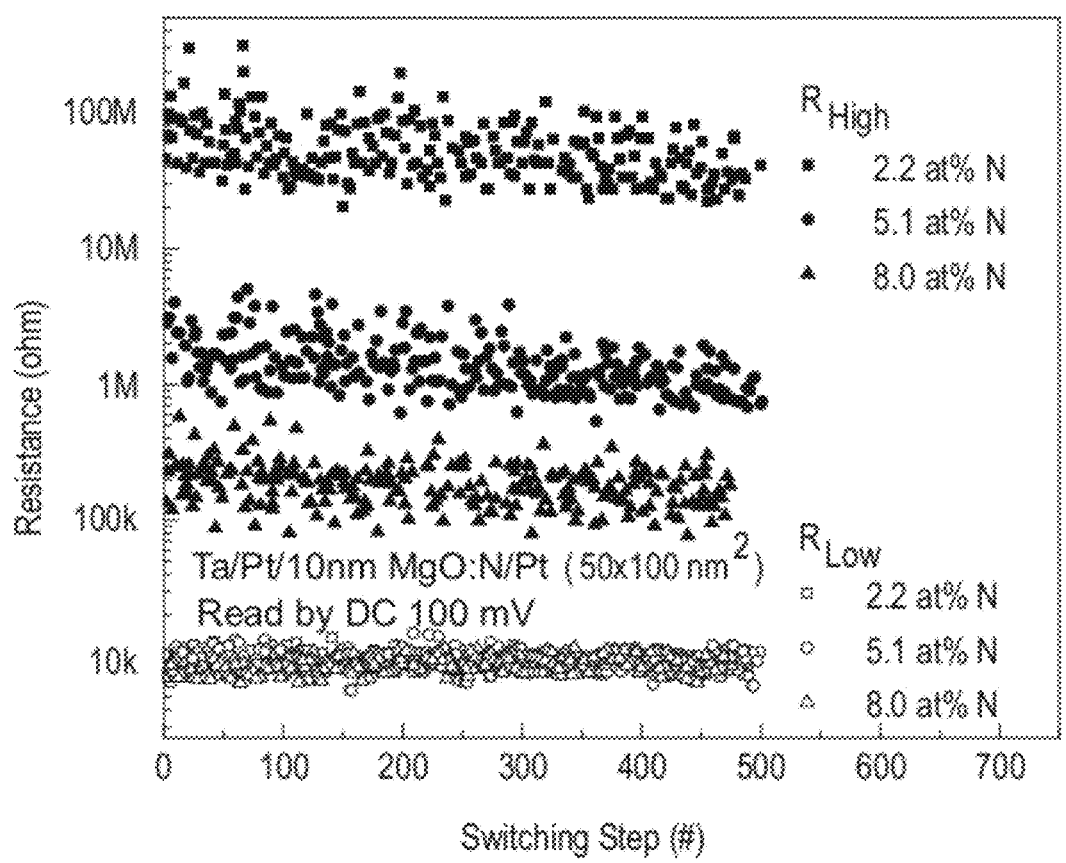
FIG. 7 shows resistance states versus switching step (i.e., going from the SET state to the RESET state or vice versa) for various nitrogen doping levels. The resistance was read after each SET or RESET at a DC voltage of 100 mV.

The switching behavior observed in nitrogen-doped MgO layers can be repeated many times as shown in FIG. 7. FIG. 7 displays the resistance values of three MIM devices (having a cross-sectional area of 50×100 nm² and with x=2.2, 5.1 and 8.0%) measured during sequential cycling of these devices between their ON-OFF states by applying suitable voltage levels. The resistance of each device was measured at a voltage of 100 mV after each switching step. As clearly shown in FIG. 7, the resistance in the OFF state ($R_{High}$) depends strongly on the N doping level. For the devices shown in FIG. 7, $R_{High}$ varies from ~80 MΩ for x=2.2% to ~200 kΩ for x=8.0%. By contrast the resistance in the ON state ($R_{Low}$) is nearly independent of the N-doping level. For the devices used in generating the data shown in FIG. 7, $R_{Low}$~9 kΩ. These devices were switched between the ON and OFF states 500 times: No significant change in the ON and OFF resistance values was found for any of the devices. Due to the limitations of the testing apparatus, switching beyond 500 times was not tested.

Note that small changes in the nitrogen doping level give rise to substantial changes in the resistance of the OFF state. $R_{High}/R_{Low}$ varies from ~10,000 for x=2.2% to 10 for x=8.0%. One can speculate that perhaps the incorporation of N into MgO gives rise to defects which nucleate the formation of conducting filamentary paths through the $Mg_{50}O_{50-x}N_x$ layer. The higher the N content, the greater the number of defects and, consequently, the more conducting are these filamentary paths, thereby lowering the resistance in the OFF state[9,16].

Figure 8A:
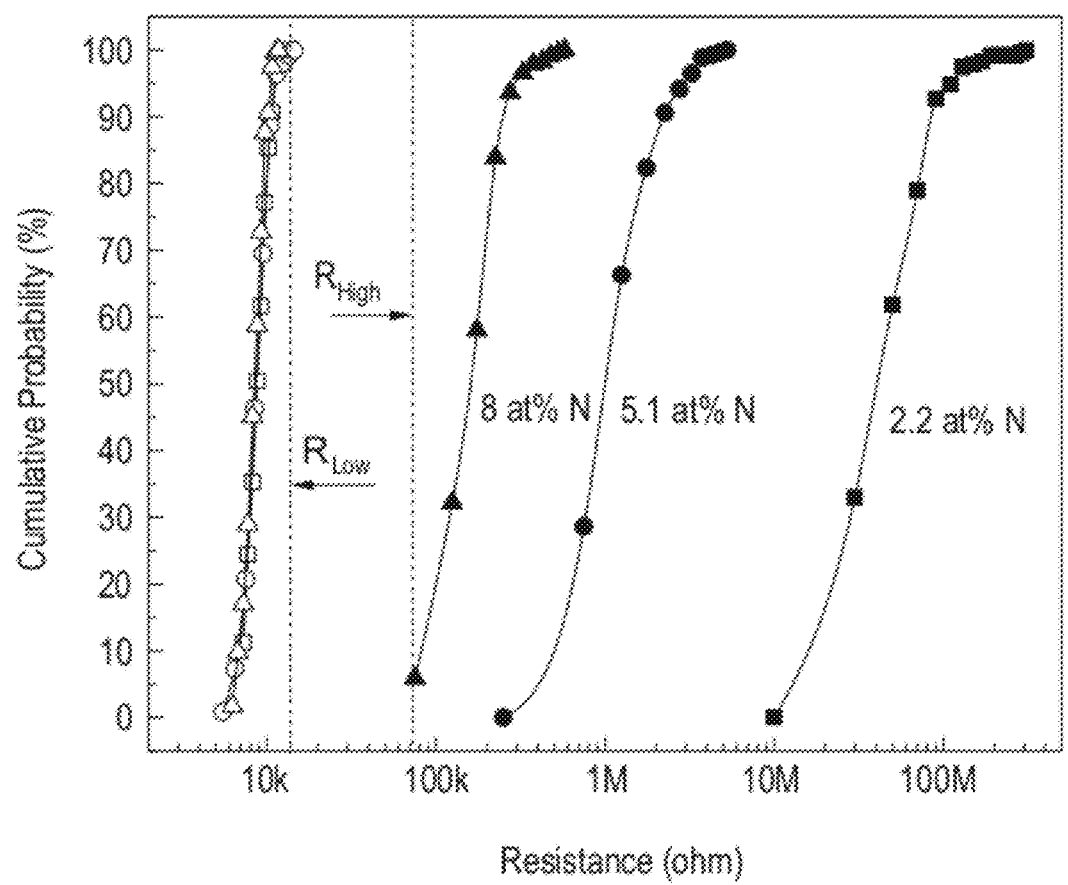
FIG. 8A shows distributions of $R_{High}$ and $R_{Low}$ obtained during the 500 switching steps summarized in FIG. 7.

As can be seen from FIG. 7, there are variations in the resistance values of the ON and OFF states from one switching cycle to the next. The cumulative probability of a device having a specified resistance value is plotted versus its resistance in FIG. 8A. Results are shown for the same MIM devices as in FIG. 7 for both $R_{High}$ (filled symbols) and $R_{Low}$ (open symbols). The distributions correspond to switching each device ON or OFF 500 times. The cumulative probability distribution of $R_{Low}$ varies little with N doping and, in addition, this distribution is significantly narrower than the distributions of $R_{High}$. Nevertheless, the distributions of $R_{Low}$ and $R_{High}$ are well separated indicating that significant margin is available for circuit designers to implement resistive switching devices based on $Mg_{50}O_{50-x}N_x$. Note that the narrower distribution of $R_{Low}$ compared to that of $R_{High}$ may be due to the precise control of the compliance current during the SET process, whereas during the RESET process the current is not limited.

Figure 8B:
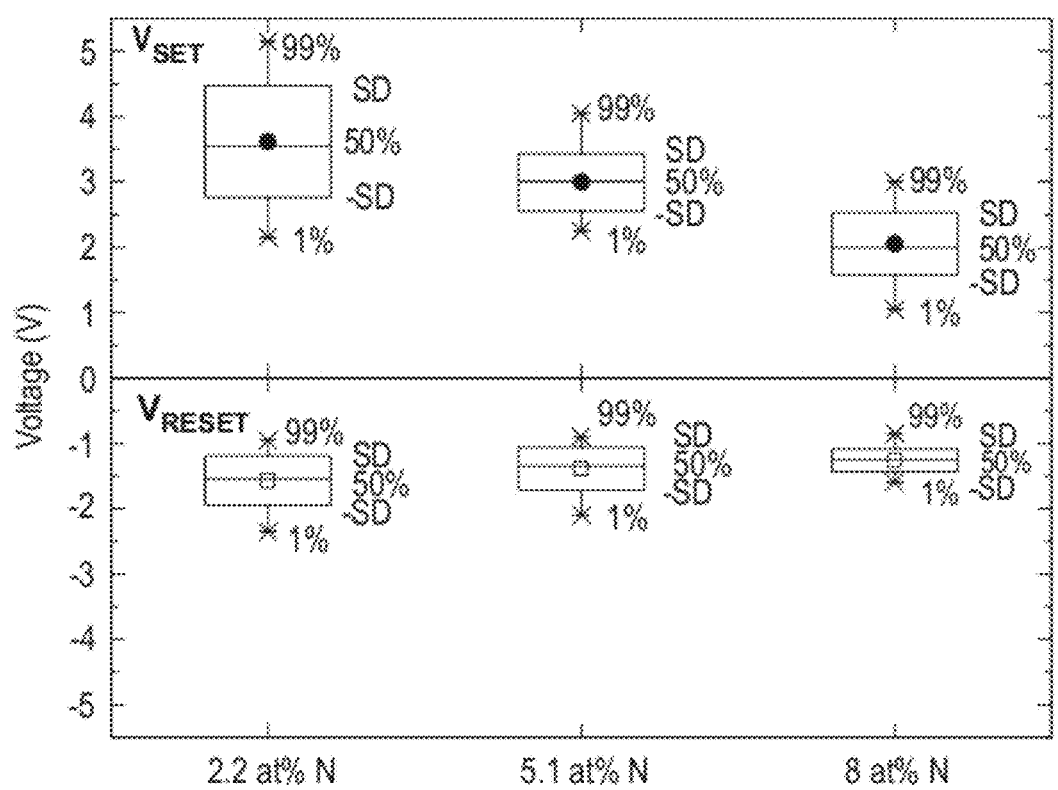
FIG. 8B shows variations of $V_{SET}$ and $V_{RESET}$ for different nitrogen doping levels. (Note that SD denotes standard deviation.)

The dependence of the switching threshold voltages ($V_{SET}$ and $V_{RESET}$) on nitrogen doping is shown in FIG. 8B. $V_{RESET}$ changes slightly with N-doping, while $V_{SET}$ is significantly reduced as the N doping is increased, for the range of N doping considered. The values of $V_{RESET}$ and $V_{SET}$ vary from one cycle to another. Assuming a Gaussian distribution of these values, the corresponding standard deviations are shown in FIG. 8B. The distributions of $V_{RESET}$ are significantly narrower than those of $V_{SET}$. This can be accounted for within the model of resistive switching in which conducting filaments are presumed to be formed[17]. It is supposed that the formation of a conducting filament is more random than the disruption of an existing filament.

Figure 9A:
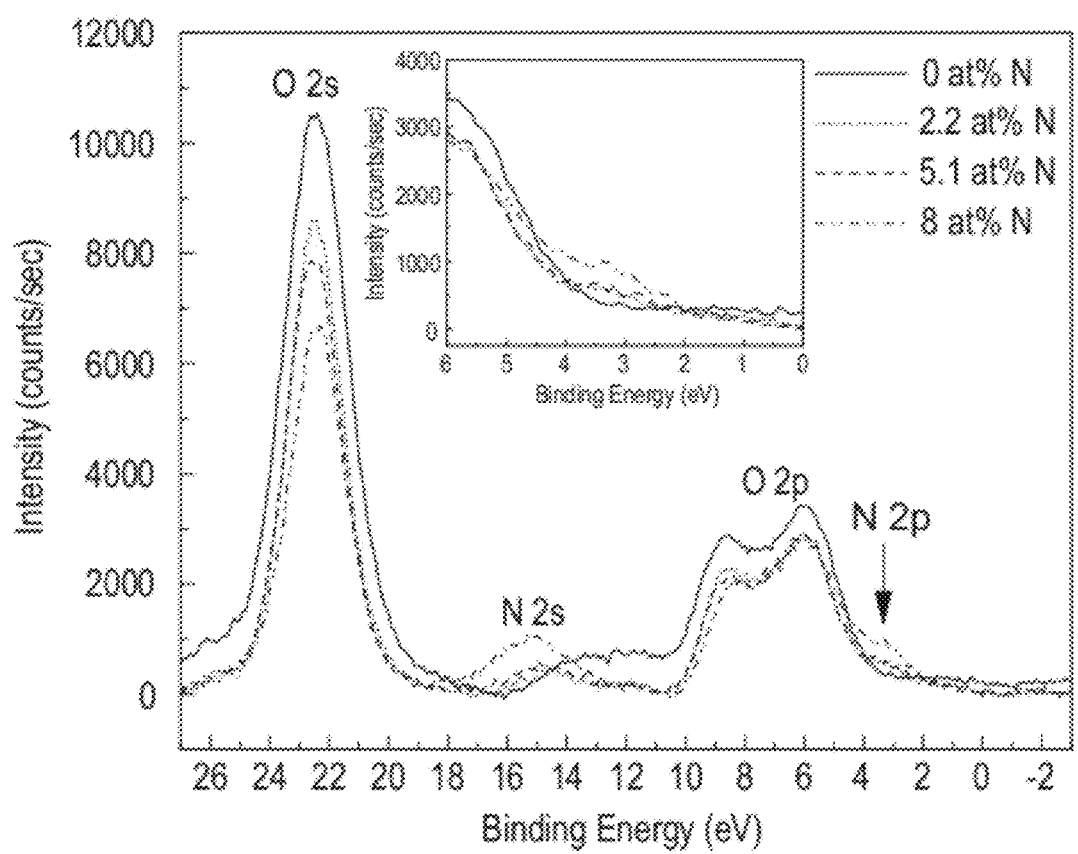
FIG. 9A shows in-situ X-ray photoemission spectra of the N-doped MgO films obtained near the valence band region. These spectra were obtained for films with various N contents. Measurements were performed at room temperature. The enlarged comparison for N 2p state is shown in the inset.

The chemical properties of the $Mg_{50}O_{50-x}N_x$ films were characterized with in-situ X-ray photoemission spectroscopy (XPS). Mg $K_\alpha$ x-rays were used as the excitation source, and the kinetic energy of the ejected photo-electrons was measured using a hemispherical energy analyzer with a pass energy of 20 eV. The emission of photo-electrons from an insulating sample can result in an accumulation of positive charge at the sample's surface, which can give rise to a shift of the XPS peaks in the spectrum to higher binding energies. To correct for this effect, an energy offset was applied to the measured spectra so that the carbon 1s line is at its expected value of 284.6 eV. FIG. 9A summarizes the XPS data from the valence band of four films with x varying from 0 to 8%. The peaks observed in the spectra correspond to the 2s and 2p levels of oxygen and nitrogen. As the N content of the film is increased, the intensity of the N 2s and 2p peaks increases, whereas the intensity of the O 2s and 2p peaks decreases. This shows that the nitrogen is indeed incorporated into the $Mg_{50}O_{50-x}N_x$ films.

Figure 9B:
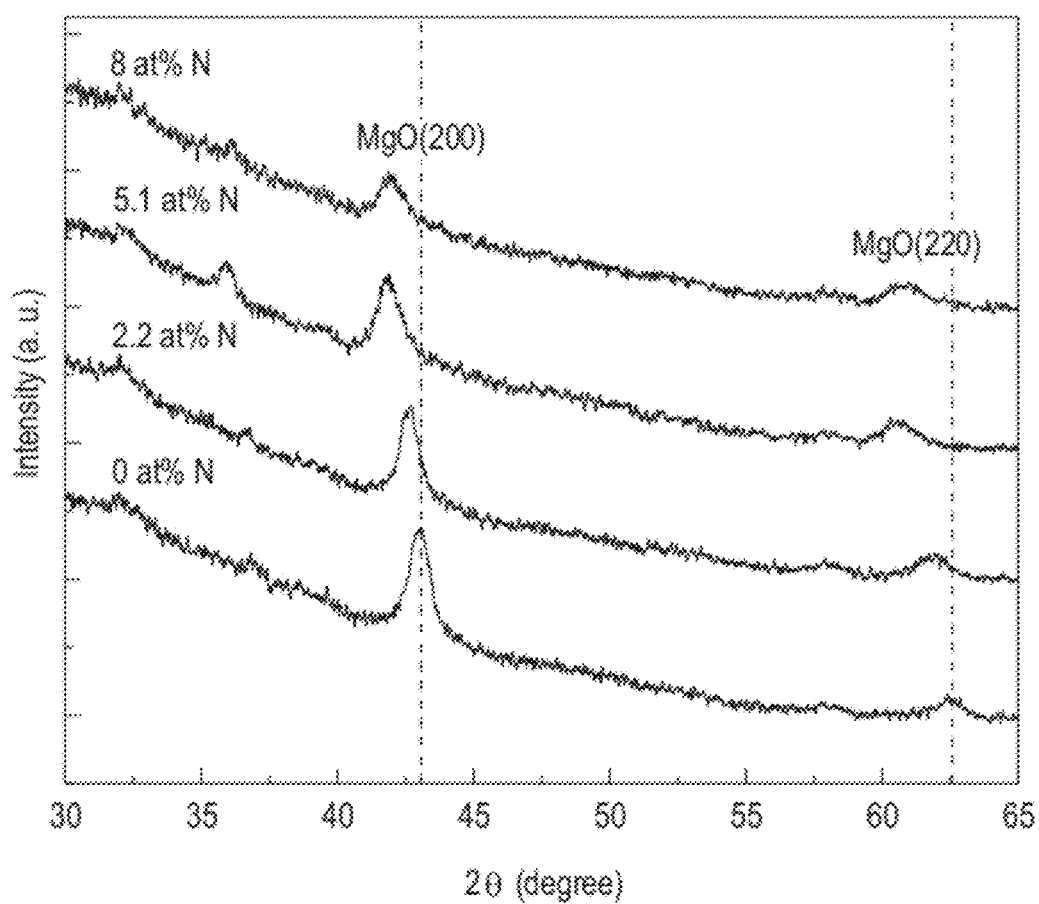
FIG. 9B shows XRD scans for films with various nitrogen contents. The vertical dashed lines are used for indicating the peak shifting.

The N 2p level is at a lower binding energy than the O 2p level. This means that N doping lowers the band-gap of the $Mg_{50}O_{50-x}N_x$ films. These films have also been characterized by X-ray diffraction (XRD). As shown in FIG. 9B, the MgO (200) and (220) X-ray diffraction peaks shift towards lower diffraction angles with increasing N doping. This indicates that nitrogen incorporation results in a lattice expansion. This lattice expansion is most likely caused by occupation of interstitial sites by N atoms. In this regard, the incorporation of N in MgO films is similar to an ion implantation process in which implanted ions occupy interstitial sites and expand the host lattice. Thus, it is expected that increasing N-doping in MgO will result in an increased number of defect states due to the increased lattice expansion. The combined effect of an increased defect density and a lowered band-gap will be a lowering of $R_{High}$ with increasing N content.

Figure 10A:
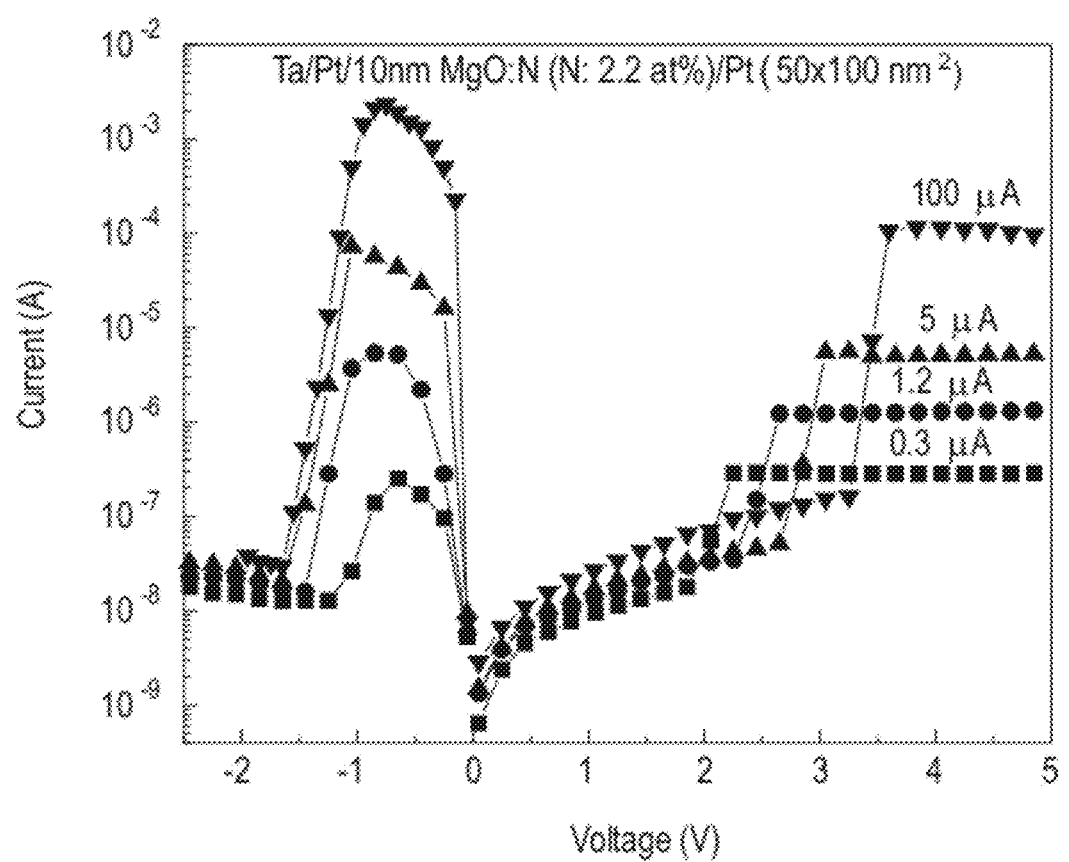
FIG. 10A shows I-V characteristics for 2.2 at % N-doped MgO with various compliance currents.
Figure 10B:
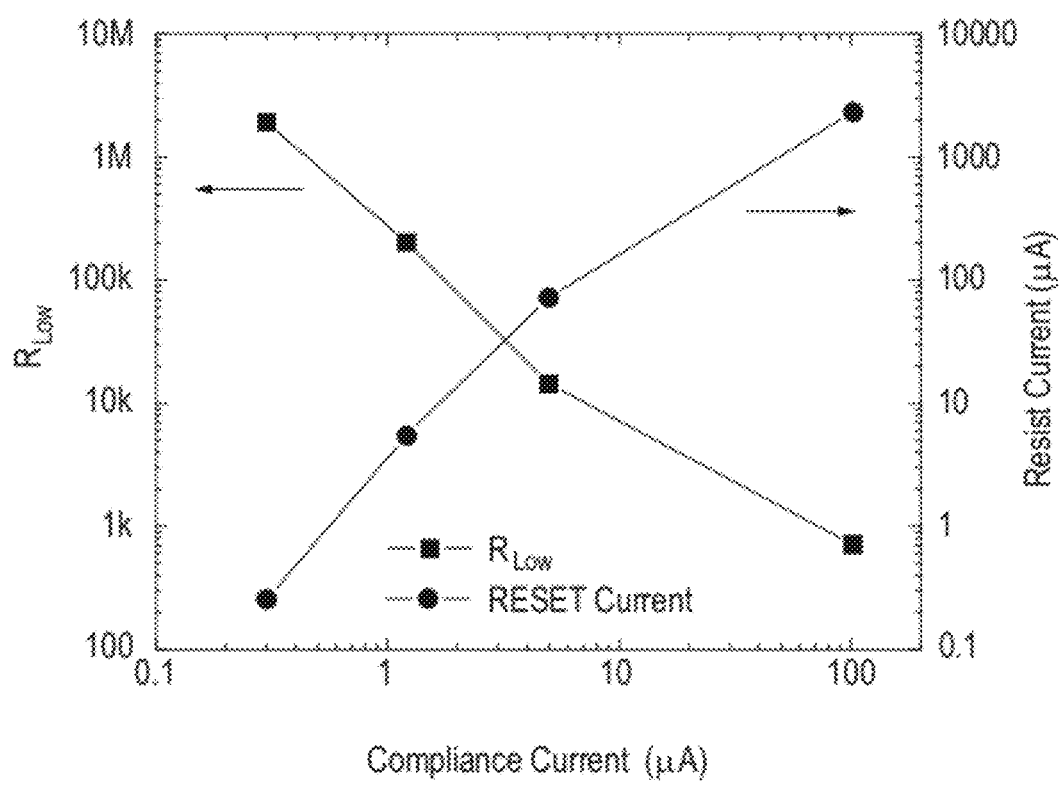
FIG. 10B plots $R_{Low}$ and RESET current versus the compliance current.

In the $Mg_{50}O_{50-x}N_x$ MIM devices it was found that the compliance current is the determining factor in the resistance of the ON state ($R_{Low}$). As mentioned earlier, the integration of an N-MOSFET transistor circuit with the resistive switching device allowed precise control of the compliance current during the SET process. FIG. 10 illustrates how $R_{Low}$ can be varied by varying the compliance current. FIG. 10A shows the dependence of the I-V characteristics of a device (with x=2.2 at % and with a cross-sectional area of 50×100 nm²) on the compliance current applied during the SET process. Data are shown for compliance currents of 0.3, 1.2, 5 and 100 µA. Clearly $V_{SET}$ is lower for lower compliance currents. FIG. 10B summarizes the dependence of $R_{Low}$ and RESET current ($I_{RESET}$) on the compliance current used during the SET process. These results can be accounted for using the conducting filament formation mechanism[18,19]. For N-doped MgO resistive switching devices the filaments are most likely formed by the electromigration of Pt electrode material. At higher compliance current during the SET process, more Pt atoms are likely to electromigrate leading to a more substantive Pt conductive filament, and this would leave the device in a lower resistance in agreement with the results shown in FIG. 10B. Since the disruption of the conductive filament happens via a process similar to blowing up of a conventional electrical fuse, to disrupt a more substantive conductive filament would require higher $V_{RESET}$ and $I_{RESET}$. Indeed this was observed for the N-doped MgO based resistive switching devices, FIGS. 10A and 10B.

Figure 10C:
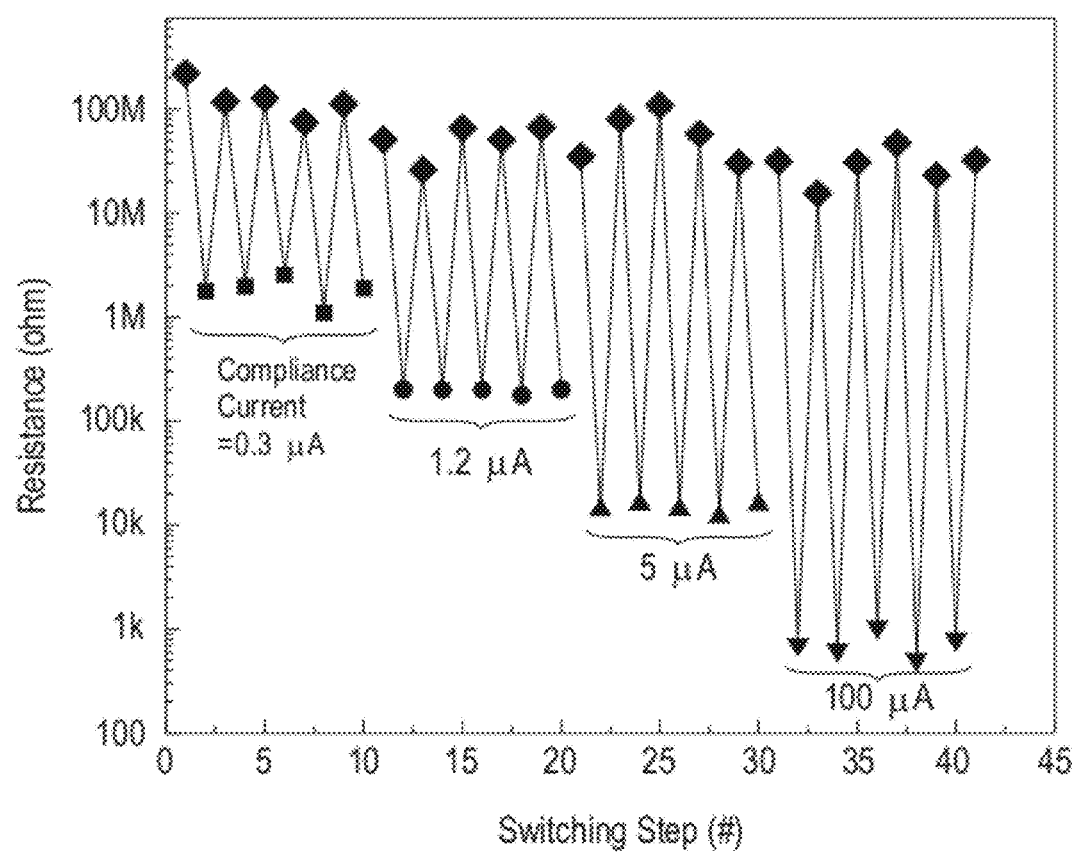
FIG. 10C shows operation of switching under different compliance currents.

The results in FIG. 10 also highlight another important property of $Mg_{50}O_{50-x}N_x$ based resistive switching devices, namely their "low power operation" with RESET currents as low as ~100 nA. The use of low compliance current results in lower values of $R_{High}/R_{Low}$ but these values can still be substantial depending on the compliance current (see FIG. 10C). Note that FIG. 10C shows a slight drift in $R_{High}$ to lower resistance values. However, this drift is observed only for the first ~100 switching steps after which the ON and OFF state resistances are stable.

Figure 11A:
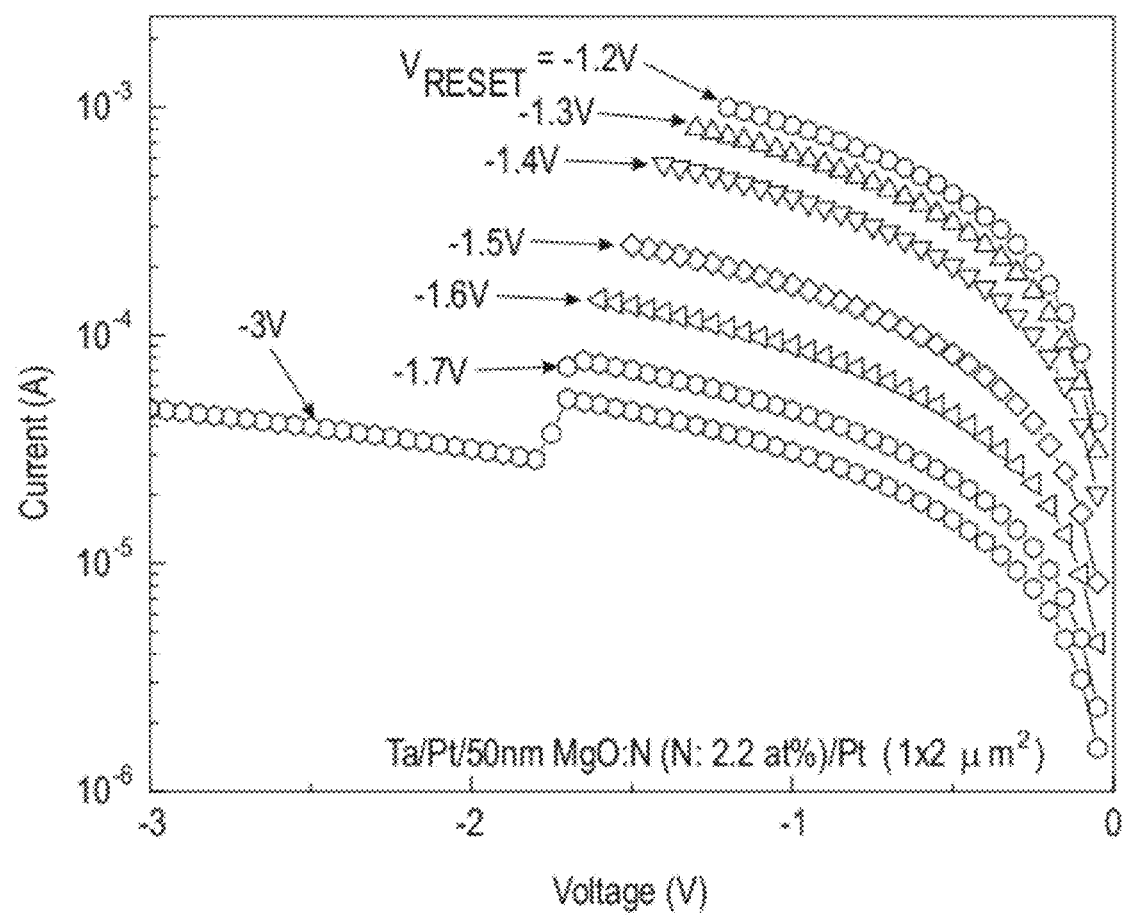
FIG. 11A illustrates I-V characteristics of the multi-level programming process for 2.2 at % N-doped MgO by manipulating the $V_{RESET}$.
Figure 11B:
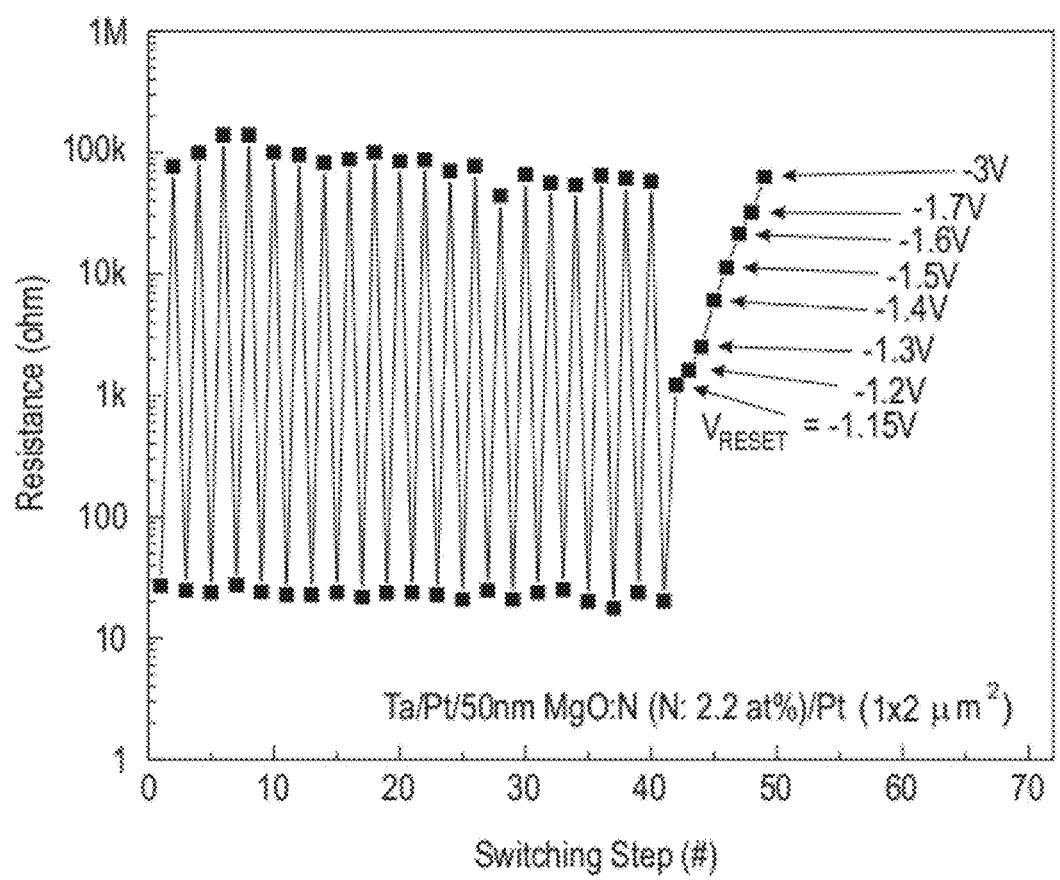
FIG. 11B shows how multi-level resistance states can be obtained by controlling $V_{RESET}$. Note that the device size is 1×2 μm$^2$ (patterned by photolithography) and the N-doped MgO thickness was maintained at 50 nm. By setting $V_{RESET}$ in the region prior to the device being completely RESET, at least seven high resistance states are demonstrated.

In addition to the manipulation of $R_{High}$ by varying the nitrogen doping level, the device can be switched into a multitude of $R_{High}$ states by varying the magnitude of $V_{RESET}$ during the RESET process, as illustrated in FIG. 11 for a device 1×2 μm² in size with x=2.2%. The detailed structure of the MIM is shown in FIG. 11. FIG. 11A presents I-V characteristics of the device during a multi-level programming process in which the RESET voltage was systematically incremented in repeated experiments. As shown in FIG. 11, the device resistance increased systematically with each increase in RESET voltage. The multi-level resistance change can be achieved by limiting $V_{RESET}$ to a value lower than that needed for a complete RESET. The device resistance following each SET or RESET step is plotted in FIG. 11B. In this experiment 8 high resistance states could be obtained by manipulating the magnitude of $V_{RESET}$. These results show that $Mg_{50}O_{50-x}N_x$ MIM devices can form multi-level (i.e., multi-bit) resistive switching memory cells.

Figure 12:
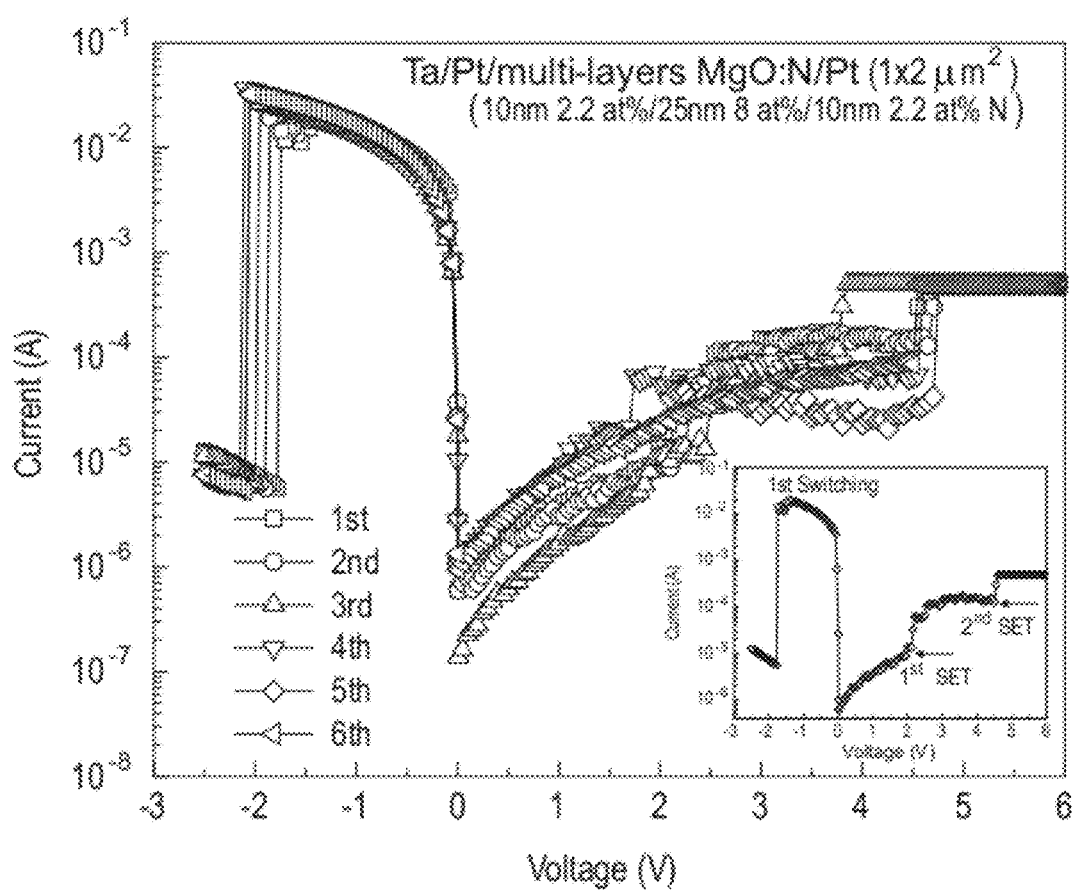
FIG. 12 illustrates two-step switching for the first five cycles (corresponding to the first five complete SET and RESET processes) during a SET process for multi-layered N-doped MgO film consisting of 10 nm thick 2.2 at % N-doped/25 nm thick 8 at % N-doped/10 nm thick 2.2 at % N-doped. Note that the device size is 1×2 μm$^2$ and was patterned by photolithography. The inset shows the first switching cycle.

Another way to form devices with multiple resistive states controlled by voltage is to engineer multilayered stacks comprised of several $Mg_{50}O_{50-x}N_x$ layers, in which x can vary from layer to layer. One such example is illustrated in FIG. 12. A structure is formed from 3 layers of $Mg_{50}O_{50-x}N_x$ with a first layer of thickness 10 nm with x=2.2%, a second layer 25 nm thick with x=8%, and a third layer nominally identical to the first layer. Results are shown in FIG. 12 for a device patterned by optical lithography to have a cross-sectional area of ~1×2 μm². As shown in the inset to FIG. 12, as a voltage is applied for the first time to the device, the current through the device shows a first step-wise increase at ~2 V and a second step-wise increase at ~4.5 V. These correspond to two independent SET processes in the $Mg_{50}O_{50-x}N_x$ layers with different N doping levels.

The two steps likely arise as follows. As shown earlier, the initial resistance of the x=2.2% doped layer will be much higher than that of the x=8% doped layer. Thus the voltage drop across the tri-layer structure of FIG. 12 will initially mostly be across the x=2.2% doped layers, so that these layers will undergo the first resistance transformation. Then the second layer (x=8%) presumably undergoes a transformation at the higher voltage step. The voltage required is higher than for the layer when directly contacted to the metal electrode, presumably because it is more difficult to form the low resistance state when the layer is remote from the metal electrode. This suggests that the formation of this state is connected to the migration of metal from the metal contact electrodes.

In contrast with the SET process, the RESET process always occurs in a single step, as illustrated in FIG. 12. This observation indicates, within the filamentary formation model, that the disruption of the conducting filament during the RESET process takes place locally rather than along the entire length of the filament. Thus one would expect that once the filament is formed during the first voltage application, that subsequent SET processes would take place at a single voltage. As shown in FIG. 12, the 2-step SET process becomes less well defined for subsequent voltage applications.

Thus while the use of multiple $Mg_{50}O_{50-x}N_x$ layers may not be useful for rewritable multi-state memories, such a structure is useful for multi-level write once memories, for example, for high density archival storage applications. By increasing the number of $Mg_{50}O_{50-x}N_x$ layers, the number of SET switching steps can be increased allowing for even greater density write-once memories.

Applications

Figure 13A:
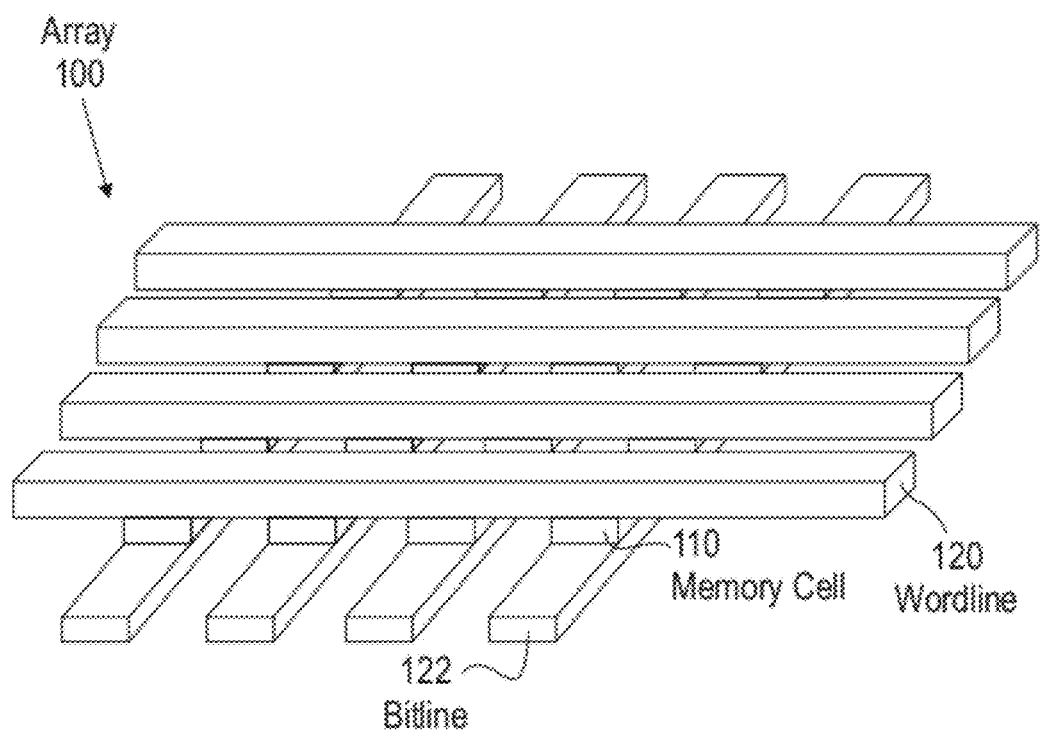
FIG. 13A shows a crosspoint memory cell architecture that employs resistive switching memory elements as the storage medium.
Figure 13B:
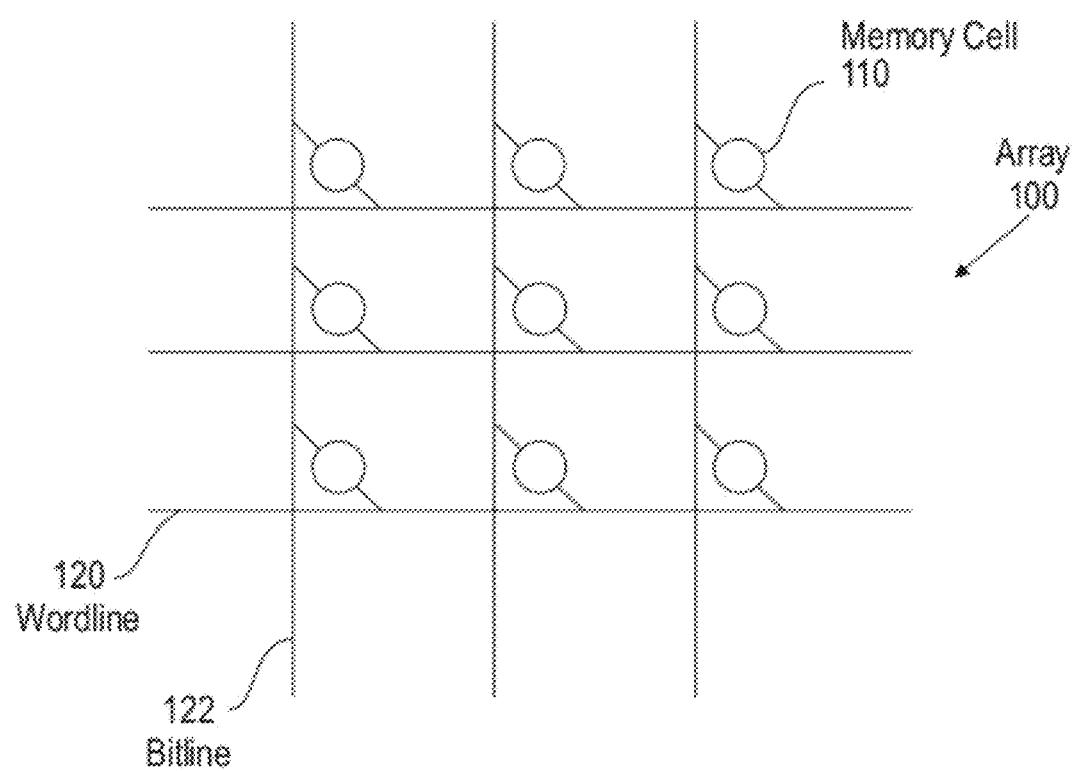
FIG. 13B is a schematic corresponding to the architecture of FIG. 13A.

A solid state memory cell array 100 is shown in FIG. 13A, which illustrates a crosspoint memory cell architecture. As shown in FIG. 13, memory cells 110 are situated at the respective "crosspoint" intersections of a conductive "word" line 120 and a conductive "bit" line 122. Each memory cell 110 includes a resistive switching element (that includes a nitrogen-doped MgO layer, as described above) for storing at least one data bit, and current can be passed through the element of a particular memory cell by selectively applying voltage to the appropriate combination of word and bit lines. The crosspoint array of FIG. 13A may be represented by the schematic shown in FIG. 13B.

Figure 13C:
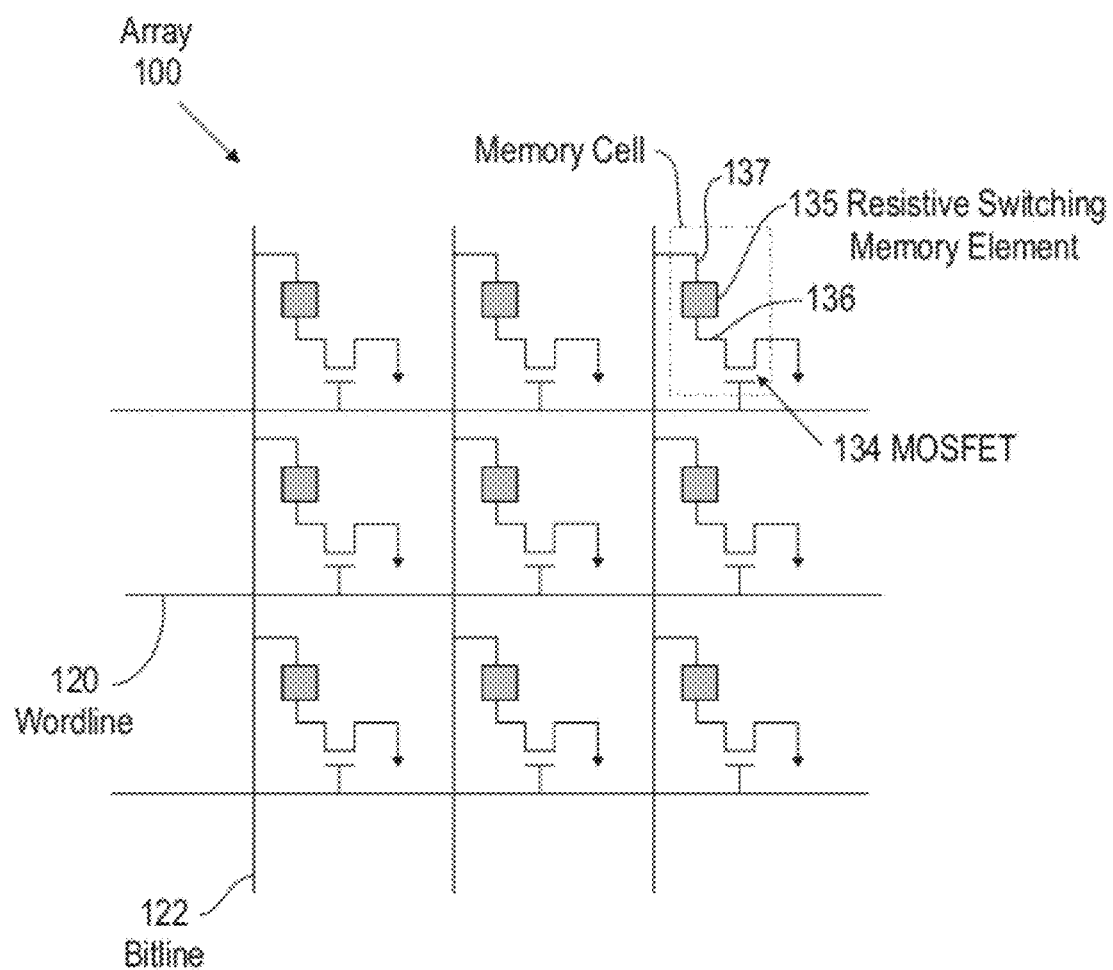
FIG. 13C is a schematic corresponding to an architecture in which each memory cell includes a select element and a resistive switching memory element.

As suggested by the embodiment of FIG. 13C, the memory cells themselves can be rather complicated. In this embodiment, each cell includes a MOSFET (metal oxide semiconductor field effective transistor) 134 and a resistive switching memory element 135 that includes a nitrogen-doped MgO layer (and may also include electrodes in contact with the nitrogen-doped MgO layer). Each memory element 135 is in electrical communication with a particular wordline 120 and a particular bitline 122. The MOSFET 134 is connected to the memory element 135 via a conductive line 136, and the gate of the MOSFET is connected to a wordline 120. The memory element 135 is also connected to a bitline 122 via another conductive line 137. As an alternative to the embodiment shown in FIG. 13C, a simplified memory cell can be employed in which the cell consists only of a memory element 135 tied directly to a respective wordline 120 and a respective bitline 122. In still other embodiments, the memory cell may include a bipolar junction transistor (BJT) and a resistive switching memory element; a diode and a resistive switching memory element; a tunneling diode and a resistive switching memory element; a magnetic tunnel junction in series with a resistive switching memory element; a resistive switching element that includes multiple $Mg_{50}O_{50-x}N_x$ layers; or some combination of the foregoing.

In summary, the doping of MgO insulating layers with nitrogen causes these layers to exhibit voltage controlled resistance states. Single $Mg_{50}O_{50-x}N_x$ layers sandwiched between metallic platinum electrodes exhibit a voltage controlled transition between two resistance states, a high resistance and a low resistance state. Patterned nano-devices on the 100 nm scale show highly reproducible switching characteristics. The voltage levels at which the device is switched between the two resistance levels can be systematically lowered by increasing the nitrogen concentration. Similarly, the resistance of the high resistance state can be varied by varying the nitrogen concentration, decreasing by orders of magnitude for nitrogen concentrations varied by a few percent. The resistance of the low resistance state is nearly insensitive to the nitrogen doping level, which suggests that the voltage induced resistance effect is due to the formation of a single (or at most a few) conducting filamentary path through the device. The resistance of single $Mg_{50}O_{50-x}N_x$ layer devices can be varied over a wide range by limiting the current that can be passed during the SET process. By using structures with several $Mg_{50}O_{50-x}N_x$ layers with different nitrogen concentrations, a write once device with multiple bits per device can be constructed.

Other applications of the resistive properties of $Mg_{50}O_{50-x}N_x$ single layer and multilayers include their use as a fuse, a point contact injector, and a synaptic device. In many electronic applications, it is useful to have devices incorporated into the circuits which can operate as a fuse, whereby the device can be switched ON or OFF to provide an electrical connection or to eliminate an electrical connection. The $Mg_{50}O_{50-x}N_x$ based device can act as such a fuse whose state is turned ON/OFF by means of a voltage pulse. Note that the fuse can consist of a vertical or lateral device, i.e., the conducting contacts between which the conducting path is created can be disposed such that one contact is above and one contact is below the $Mg_{50}O_{50-x}N_x$ material, or alternatively the contacts can be placed on the same side of this material (i.e., in this case they are both above or both below the material).

The ON state of the $Mg_{50}O_{50-x}N_x$ based device likely consists of a single finite size conducting filament that is created within the device by the application of the voltage pulse. Thus, this filament can serve as a point contact to another electrical device, e.g., a magnetic tunnel junction device. When a voltage is applied across the $Mg_{50}O_{50-x}N_x$ based device to create an ON state, a filament is formed within the $Mg_{50}O_{50-x}N_x$ based material that is much smaller in diameter than the size of the $Mg_{50}O_{50-x}N_x$ based device, thereby enabling the formation of an electrical connection to a second electrical device that is much smaller than the size of this device. For example, if these devices are fabricated with a CMOS based process, then depending on the technology node the minimum feature size is limited to 65 nm or 45 nm in today's commonly used technologies or 32 nm or 22 nm, or 15 nm, for example, in technology nodes under development. Thus electrical connections or wires cannot be smaller (unless advanced processing techniques are used) than these dimensions. For some applications, further limiting the dimension of an electrical connection or wire may be advantageous. For example, in a magnetic tunnel junction device comprised of at least two magnetic electrodes separated by a thin dielectric layer, which acts as the tunnel barrier, it may be advantageous to limit the region of the device through which the current passes to a size that is much smaller than the physical extent of the magnetic tunnel junction device. This can be achieved by attaching in series with the magnetic tunnel junction device a resistive switching element. This resistive switching element can be composed of one or more layers of $Mg_{50}O_{50-x}N_x$ but could also be composed of other materials which display resistive switching behavior.

Another application of the resistive switching properties of $Mg_{50}O_{50-x}N_x$ is with regard to the fabrication of devices that display synaptic characteristics. In application Ser. No. 12/395,695 filed Mar. 1, 2009 to Modha and Parkin titled "Stochastic synapse memory element with spike-timing dependent plasticity (STDP)" (which is hereby incorporated by reference), the formation of a magnetic tunnel junction device which displays plasticity (i.e., a change in conductance of the device during its operation) and "spike timing dependent plasticity" is discussed. MIM devices formed from $Mg_{50}O_{50-x}N_x$ materials can also be used instead of, or in conjunction with, magnetic tunnel junction devices to operate with synaptic characteristics. MIM devices using $Mg_{50}O_{50-x}N_x$ materials can be used, for example, in a cross-point geometry (as shown in FIG. 13) to form a computing device that takes advantage of the synaptic characteristics of the $Mg_{50}O_{50-x}N_x$ materials. By way of example, by applying voltage pulses across these materials with particular temporal forms, the conductance of the device will evolve. Again, the $Mg_{50}O_{50-x}N_x$ materials can be used either in a vertical or in a lateral geometry. One of the most important characteristics of the biological synapse is STDP, which is the change in conductance of the synapse under the influence of a combination of two or more voltage spikes from the pre-synaptic and post-synaptic neurons to which a synapse is connected. These neurons give rise to a series of voltage spikes. When the pre-synaptic neuron spikes before and within a characteristic period of time (typically from 0 to 100 milliseconds) of the spiking of the post-synaptic neuron, then the conductance of the synapse will be increased, by typically a few percent. Conversely, when the pre-synaptic neuron spikes after the post-synaptic neuron within a similar time period, then the synapse weakens, i.e., its conductance will be decreased, by typically a few percent. This behavior, wherein the conductance of the synapse will evolve plastically depending upon the temporal spiking of the pre- and post-synaptic neurons, essentially defines a switch having synaptic characteristics. Nitrogen-doped MgO devices can behave as a synapse if a combination of two or more voltage pulses having a suitable temporal form is delivered to the device, such that the conductance of the device is increased or decreased depending upon the relative arrival time of these pulses.

The invention may be embodied in other specific forms without departing from its spirit or essential characteristics. The described embodiments are to be considered in all respects only as illustrative and not restrictive. The scope of the invention is therefore indicated by the appended claims rather than the foregoing description. All changes within the meaning and range of equivalency of the claims are to be embraced within that scope.

References

[1] R. Waser, R. Dittmann, G. Staikov, and K. Szot, Adv. Mater. 21, 2632 (2009).
[2] D. C. Kim, S. Seo, S. E. Ahn, D.-S. Suh, M. J. Lee, B.-H. Park, I. K. Yoo, I. G. Baek, H.-J. Kim, E. K. Yim, J. E. Lee, S. O. Park, H. S. Kim, U.-I. Chung, J. T. Moon, and B. I. Ryu, Appl. Phys. Lett. 88, 202102 (2006).
[3] N. Xu, L. Liu, X. Sun, X. Liu, D. Han, Y. Wang, R. Han, J. Kang, and B. Yu, Appl. Phys. Lett. 92, 232112 (2008).
[4] H. Y. Lee, P. S. Chen, T. Y. Wu, Y. S. Chen, C. C. Wang, P. J. Tzeng, C. H. Lin, F. Chen, C. H. Lien, and M.-J. Tsai, presented at the IEDM, 2008 (unpublished).
[5] C. Yoshida, K. Tsunoda, H. Noshiro, and Y. Sugiyama, Appl. Phys. Lett. 91, 223510 (2007).
[6] Y. Dong, G. Yu, M. C. McAlpine, W. Lu, and C. M. Lieber, Nano Lett. 8 (2), 386 (2008).
[7] S. H. Jo and W. Lu, Nano Lett. 8 (2), 392 (2008).
[8] R. Waser and M. Aono, Nat. Mater. 6 (11), 833 (2007).
[9] C. Park, S. H. Jeon, S. C. Chae, S. Han, B. H. Park, S. Seo, and D.-W. Kim, Appl. Phys. Lett. 93, 042102 (2008).
[10] J. Y. Son and Y. H. Shin, Appl. Phys. Lett. 92 (22), 222106 (2008).
[11] T. Sakamoto, H. Sunamura, H. Kawaura, T. Hasegawa, T. Nakayama, and M. Aono, Appl. Phys. Lett. 82 (18), 3032 (2003).
[12] K. Terabe, T. Hasegawa, T. Nakayama, and M. Aono, Nature 433, 47 (2005).
[13] M.-J. Lee, Y. Park, D.-S. Suh, E.-H. Lee, S. Seo, D.-C. Kim, R. Jung, B.-S. Kang, S.-E. Ahn, C. B. Lee, D. H. Seo, Y.-K. Cha, I.-K. Yoo, J.-S. Kim, and B. H. Park, Adv. Mater. 19, 3919 (2007).
[14] X. Chen, G. Wu, P. Jiang, W. Liu, and D. Bao, Appl. Phys. Lett. 94 (3), 033501 (2009).
[15] X. Chen, G. Wu, and D. Bao, Appl. Phys. Lett. 93, 093501 (2008).
[16] I. S. Elfimov, A. Rusydi, S. I. Csiszar, Z. Hu, H. H. Hsieh, H. J. Lin, C. T. Chen, R. Liang, and G. A. Sawatzky, Phys. Rev. Lett. 98 (13), 137202 (2007).
[17] Y. C. Yang, F. Pan, Q. Liu, M. Liu, and F. Zeng, Nano Lett. 9 (4), 1636 (2009).

[18] S. Seo, M. J. Lee, D. H. Seo, E. J. Jeoung, D. S. Suh, Y. S. Joung, I. K. Yoo, I. R. Hwang, S. H. Kim, I. S. Byun, J. S. Kim, J. S. Choi, and B. H. Park, Appl. Phys. Lett. 85 (23), 5655 (2004).

[19] C. Rohde, B. J. Choi, D. S. Jeong, S. Choi, J.-S. Zhao, and C. S. Hwang, Appl. Phys. Lett. 86, 262907 (2005).

The invention claimed is:

1. A device, comprising:
an array of resistive switching elements each of which is in electrical communication with a word line and a bit line, each of the elements including a N-doped MgO layer whose N content is at least 0.1 atomic percent of the layer, wherein the resistance of each of the N-doped MgO layers can be reversibly changed between higher and lower resistance states by applying a voltage pulse across it, so that the resistance of its corresponding element is switched between higher and lower resistance states, respectively.

2. The device of claim 1, wherein the N content of each layer is between 0.1 and 14 atomic percent.

3. The device of claim 1, wherein the device is a two-dimensional cross point array.

4. The device of claim 1, wherein at least one element includes a magnetic tunnel junction that is in electrical series with said at least one element.

5. The device of claim 1, wherein a given switching element has an "ON" state having a resistance $R_{Low}$ and an "OFF" state having a resistance $R_{High}$, wherein the ratio $R_{High}/R_{Low}$ is between 10 and $10^6$.

6. The device of claim 1, wherein each of a plurality of the switching elements includes multiple N-doped MgO layers, each of the multiple N-doped MgO layers having a resistance state that can be reversibly changed by applying a voltage across it.

7. The device of claim 1, wherein data are stored in the switching elements.

8. The device of claim 7, wherein no initialization (forming) step is required before data can be written into the device.

9. The device of claim 7, wherein the data stored in the switching elements can be replaced by overwriting the data with different data.

10. The device of claim 9, wherein the overwriting process can be performed hundreds of times.

11. The device of claim 1, wherein each of the layers has a thickness of between 1 nm and 100 nm.

12. The device of claim 1, wherein the N content of each layer is at least 2 atomic percent.

13. The device of claim 1, wherein the N content of each layer is at least 5 atomic percent.

14. The device of claim 1, wherein the N content of each layer is at least 8 atomic percent.

15. A method, comprising:
applying voltage to a particular one of the elements of the device of claim 1, thereby changing the resistance state of said particular element, wherein the voltage is selected in view of its N content.

16. The method of claim 15, wherein the resistance of said particular element increases as a result of applying the voltage.

17. The method of claim 15, wherein the resistance of said particular element decreases as a result of applying the voltage.

18. The method of claim 15, comprising:
applying a SET voltage to said particular element, thereby switching it to an "ON" state having a resistance $R_{Low}$ between $R_a$ and $R_b$; and
applying a RESET voltage to said particular element, thereby switching it to an "OFF" state having a resistance $R_{High}$ between $R_c$ and $R_d$, wherein $R_a < R_b < R_c < R_d$.

19. The method of claim 18, wherein no initialization (forming) step is required.

20. The method of claim 18, wherein the method of claim 18 is applied to all the switching elements in the device.

21. The method of claim 18, wherein a plurality of the switching elements include different regions, each of the regions having a resistance state that can be changed by applying a voltage across the region, the device functioning as a write-once device.

22. The method of claim 15, comprising applying voltage pulses across a plurality of the elements, so that the conductance of the device evolves plastically in a way that depends upon the relative arrival times of the voltage pulses, the device thereby acting as a synaptic device.

23. A method for use with a resistive switching element, the element including i) a first conducting layer, ii) a $Mg_{50}[O_{50-x}N_x]$ layer, wherein x is at least 0.1, and iii) a second conducting layer, wherein the first conducting layer, the $Mg_{50}[O_{50-x}N_x]$ layer, and the second conducting layer are in proximity with each other, thereby allowing current to pass through the first conducting layer, the $Mg_{50}[O_{50-x}N_x]$ layer, and the second conducting layer, in turn, the method comprising:
applying voltage to the element, so that the $Mg_{50}[O_{50-x}N_x]$ layer is switched to a lower resistance state; and
apply voltage to the element, so that the $Mg_{50}[O_{50-x}N_x]$ layer is switched to a higher resistance state.

24. The method of claim 23, wherein the first and second conducting layers both include ferromagnetic material.

25. The method of claim 23, wherein the first and second conducting layers both include non-magnetic material.

26. The method of claim 23, wherein the element is part of an electrical circuit that includes at least one other electrical component, the method further comprising:
applying a voltage pulse to the element, thereby eliminating an electrical connection between the element and said at least one other electrical component, the element acting as a fuse in response to applying voltage to the element.

27. The method of claim 26, further comprising applying voltage to the element, so that an electrical connection between the element and said at least one other electrical component is reestablished.

28. The method of claim 23, wherein the element is in proximity with an electrical component, the method comprising applying voltage across the element to create an ON state, thereby forming a filament within the element having a diameter that is smaller than a diameter of the electrical component, the element acting as a point contact injector for the electrical component.

29. The method of claim 23, wherein x is at least 2.

30. The method of claim 23, wherein x is at least 5.

31. The method of claim 23, wherein x is at least 8.

32. The method of claim 15, wherein the resistance of said particular element is decreased by forming conductive paths within its corresponding MgO layer.

33. The method of claim 15, wherein the resistance of said particular element is increased by disrupting conductive paths within its corresponding MgO layer.

* * * * *